United States Patent
Sandstrom et al.

(10) Patent No.: US 6,621,846 B1
(45) Date of Patent: Sep. 16, 2003

(54) ELECTRIC DISCHARGE LASER WITH ACTIVE WAVELENGTH CHIRP CORRECTION

(75) Inventors: Richard L. Sandstrom, Encinitas, CA (US); Palash P. Das, Vista, CA (US); George J. Everage, San Diego, CA (US); Frederick G. Erie, Encinitas, CA (US); William N. Partlo, Poway, CA (US); Igor V. Fomenkov, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/501,160

(22) Filed: Feb. 9, 2000

Related U.S. Application Data

(63) Continuation-in-part of application No. 09/490,835, filed on Jan. 25, 2000, now Pat. No. 6,317,447, and a continuation-in-part of application No. 08/898,630, filed on Jul. 22, 1997, now Pat. No. 6,078,599.

(51) Int. Cl.[7] .............................. H01S 3/22; H01S 3/223
(52) U.S. Cl. .............................. 372/57; 372/20; 372/32; 372/34
(58) Field of Search .............................. 372/20, 32, 34, 372/57

(56) References Cited

U.S. PATENT DOCUMENTS

| | | | |
|---|---|---|---|
| 5,608,561 A | * 3/1997 | Marcuse et al. ............. 359/161 |
| 5,835,520 A | * 11/1998 | Das et al. ..................... 372/57 |
| 5,870,420 A | 2/1999 | Webb .......................... 372/58 |
| 6,128,323 A | 10/2000 | Myers et al. ................ 372/38 |
| 6,330,253 B1 | * 12/2001 | Tuganov et al. .............. 372/9 |

* cited by examiner

*Primary Examiner*—Paul Ip
*Assistant Examiner*—Davienne Monbleau
(74) *Attorney, Agent, or Firm*—John R. Ross

(57) ABSTRACT

Electric discharge laser with active chirp correction. This application discloses techniques for moderating and dispensing these pressure waves. In some lasers small predictable patterns remain which can be substantially corrected with active wavelength control using relatively slow wavelength control instruments of the prior art. In a preferred embodiment a simple learning algorithm is described to allow advance tuning mirror adjustment in anticipation of the learned chirp pattern. Embodiments include stepper motors having very fine adjustments so that size of tuning steps are substantially reduced for more precise tuning. However, complete elimination of wavelength chirp is normally not feasible with structural changes in the laser chamber and advance tuning; therefore, Applicants have developed equipment and techniques for very fast active chirp correction. Improved techniques include a combination of a relatively slow stepper motor and a very fast piezoelectric driver. In another preferred embodiment chirp correction is made on a pulse-to-pulse basis where the wavelength of one pulse is measured and the wavelength of the next pulse is corrected based on the measurement. This correction technique is able to function at repetition rates as rapid as 2000 Hz and greater.

40 Claims, 33 Drawing Sheets

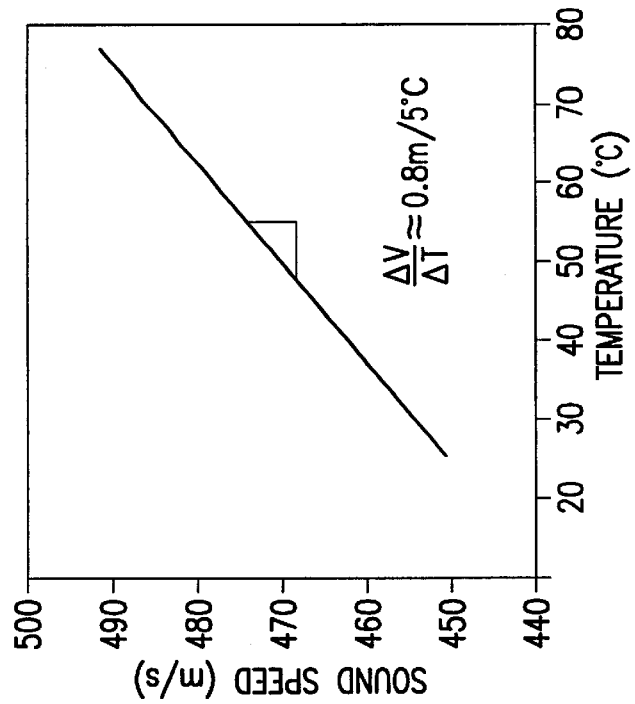
FIG. 1
PRIOR ART
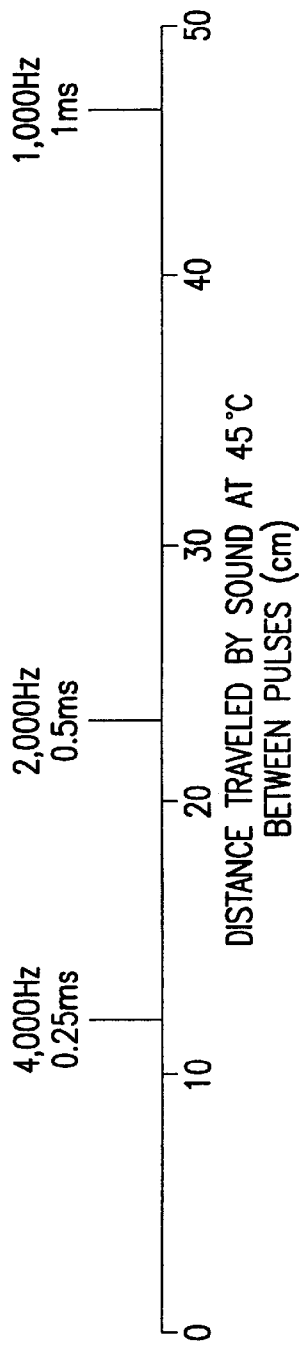
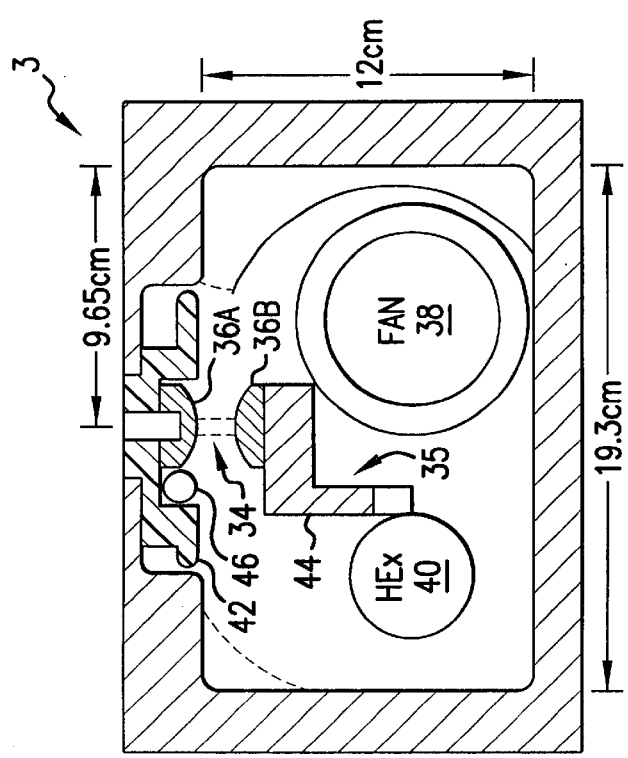
FIG. 2B
FIG. 2A

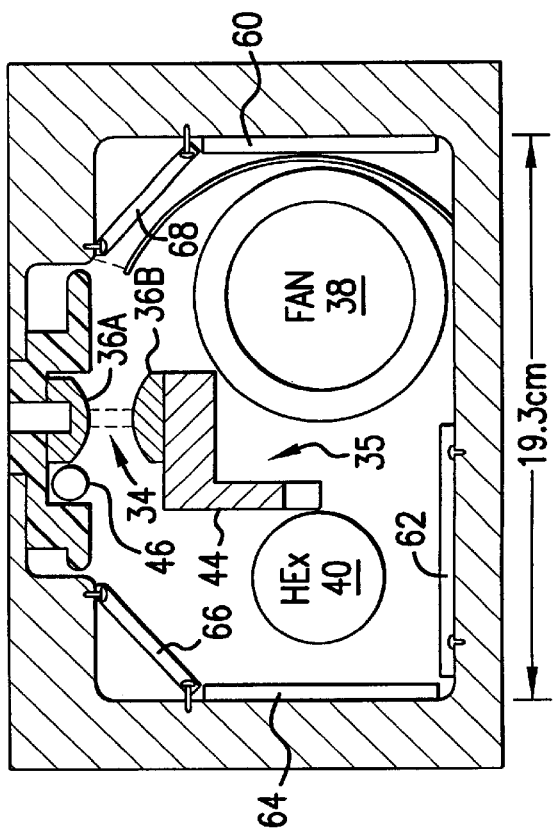
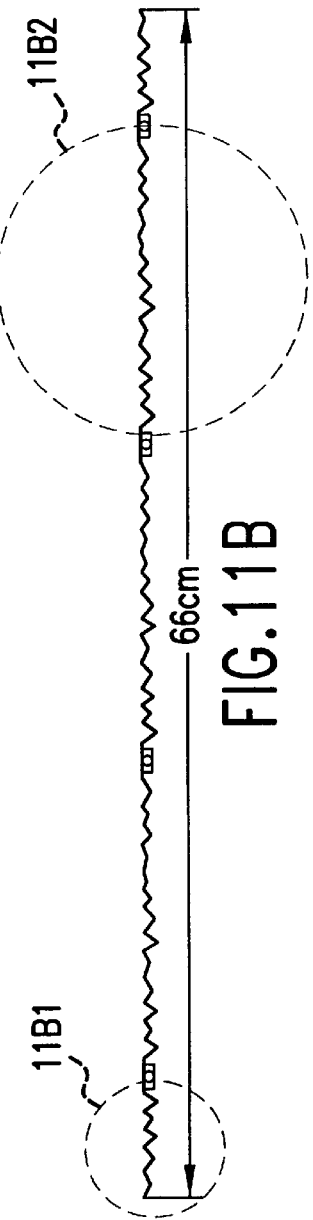
FIG. 11A
FIG. 11B

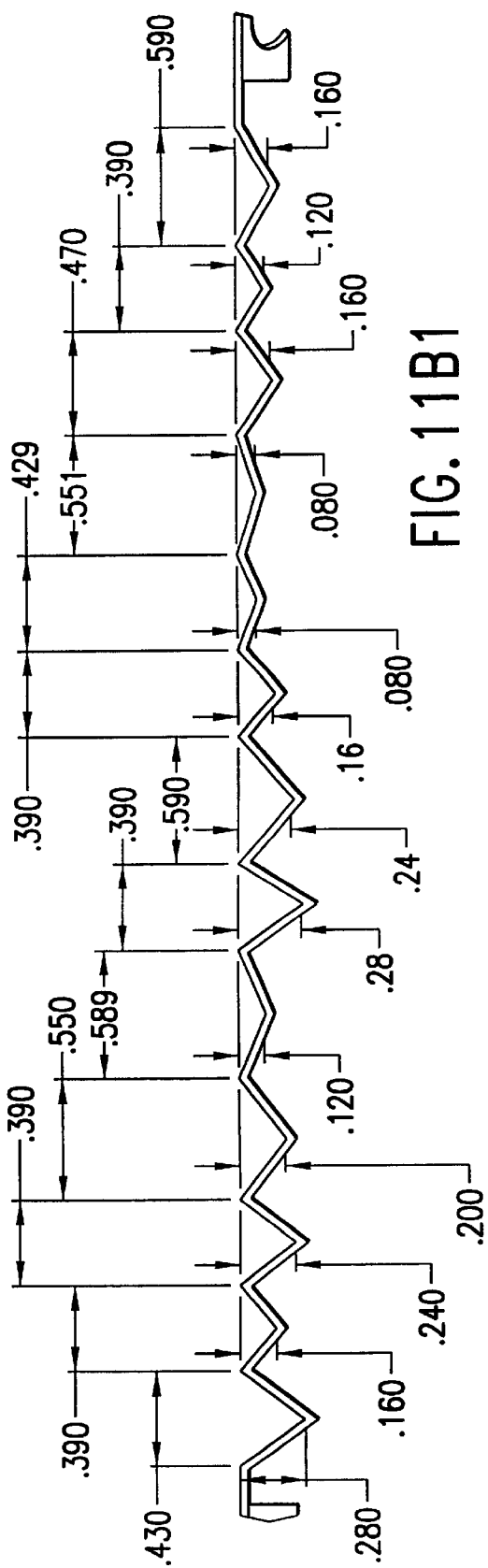
FIG. 11B1
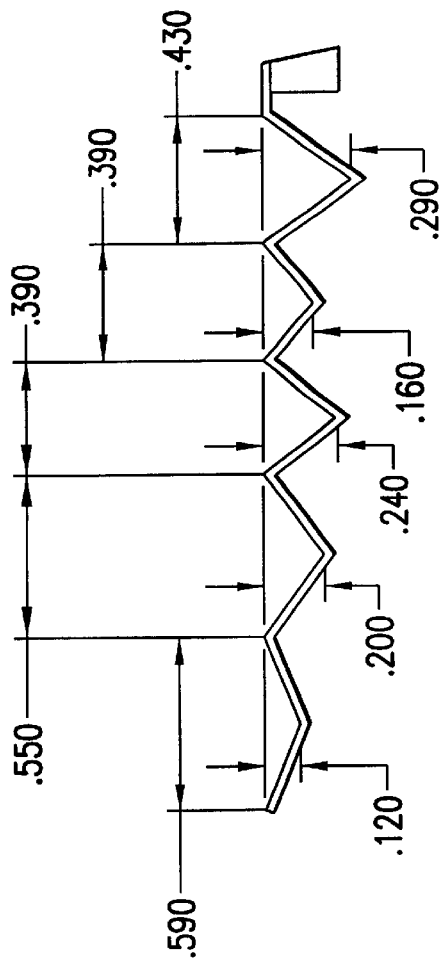
FIG. 11B2

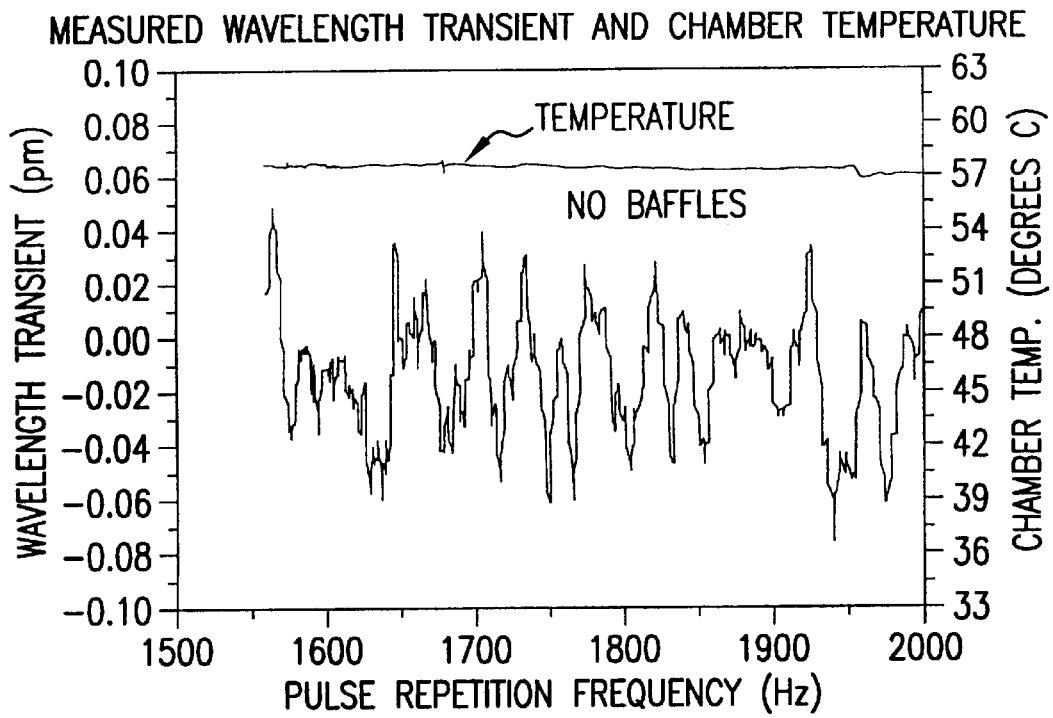
FIG.11C1
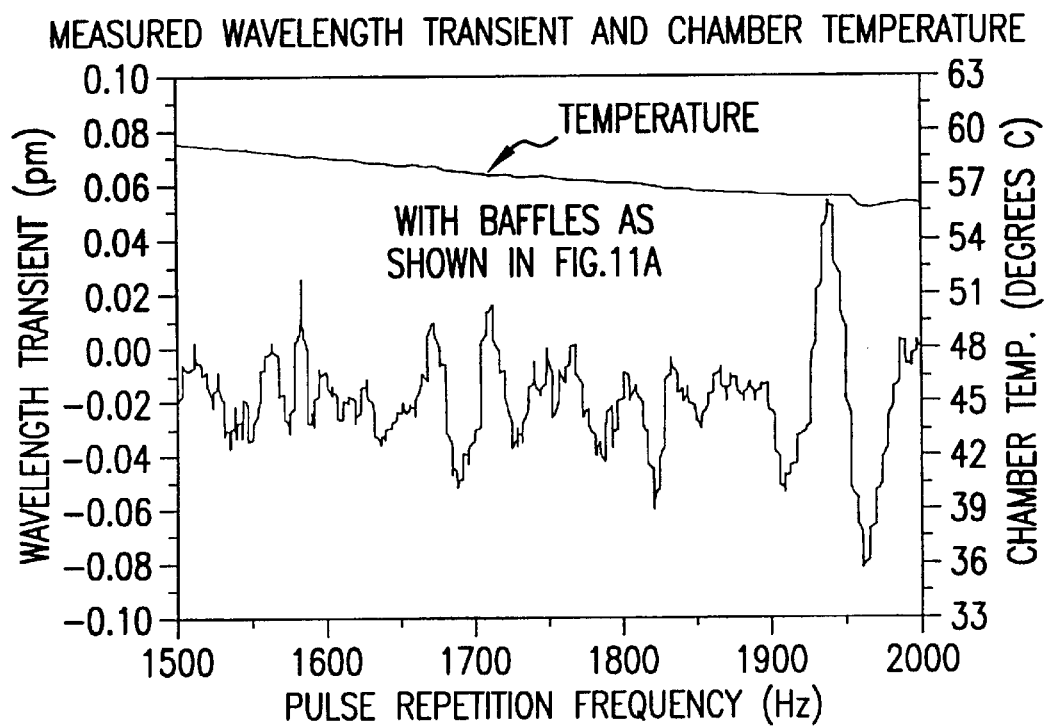
FIG.11C2

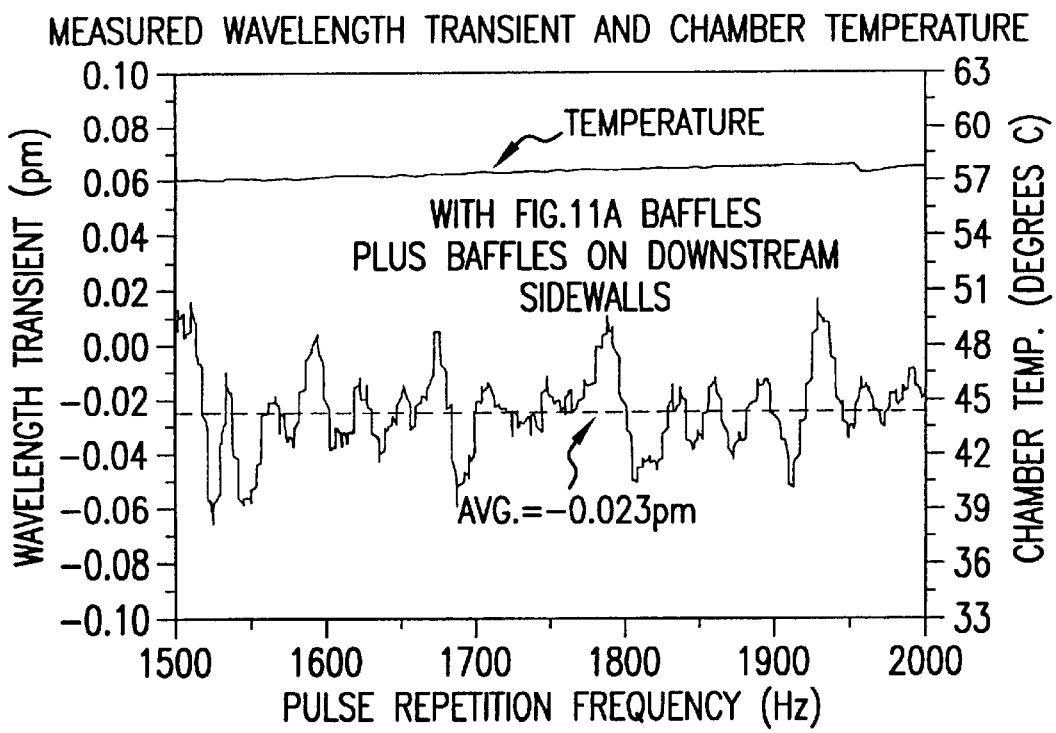
FIG.11C3
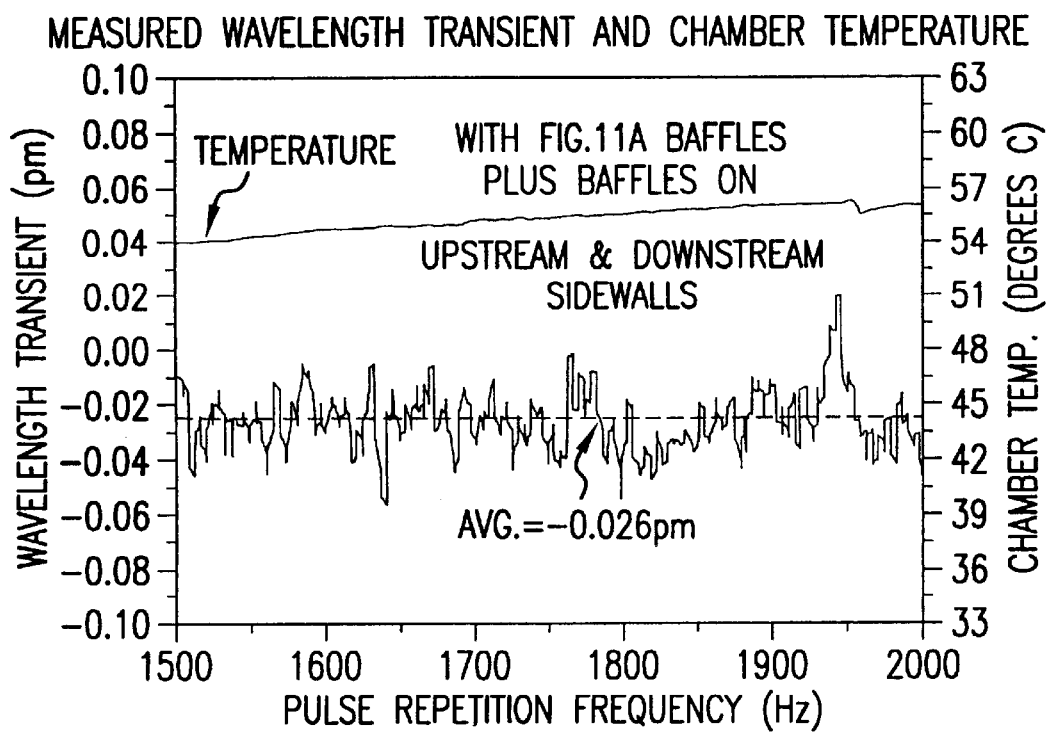
FIG.11C4

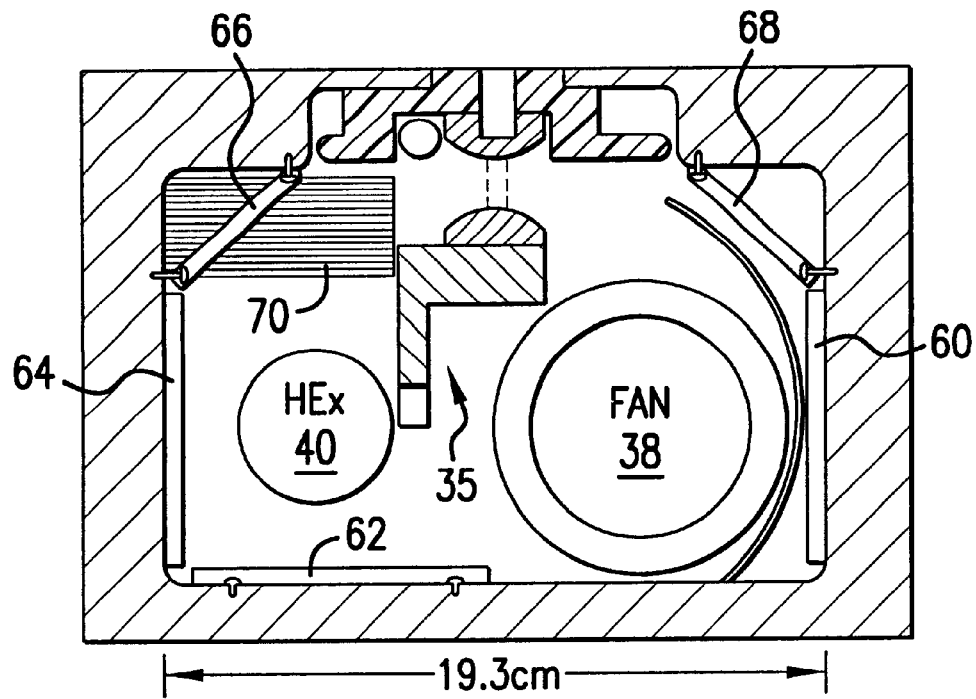
FIG.11D1
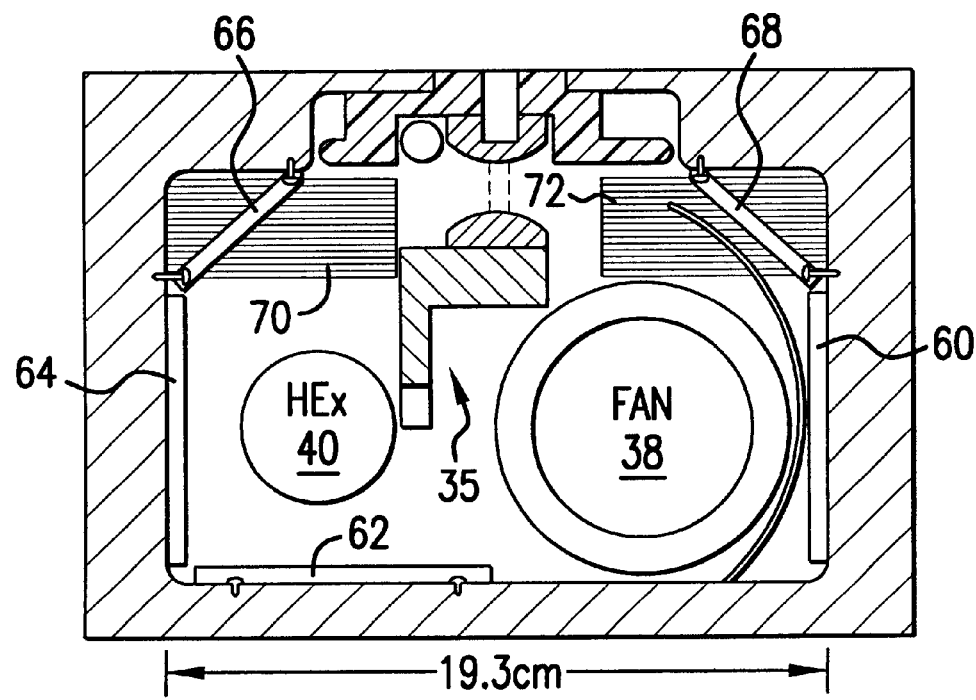
FIG.11D2

ELECTRIC DISCHARGE LASER WITH ACTIVE WAVELENGTH CHIRP CORRECTION

This application is a continuation-in-part of Ser. No. 08/898,630, filed Jul. 22, 1997, now U.S. Pat. No. 6,078,599 and Ser. No. 09/490,835, filed Jan. 25, 2000, now U.S. Pat. No. 6,317,447. The present invention relates to laser discharge lasers and in particular to lasers having provisions for correction of acoustic disturbances.

BACKGROUND OF THE INVENTION

FIG. 1 is a drawing of the cross section of a typical KrF excimer laser chamber. The gain region of the laser is a discharge region with a cross section of about 20 mm×4 mm shown as 34 in FIG. 1 with a length between elongated electrodes 36A and 36B of about 70 cm. In the chamber laser gas is circulated by fan 38 and cooled by heat exchanger 40. Also shown in FIG. 1 are main insulator 42, anode support bar 44 and preionizer rod 46.

An important use of electric discharge lasers such as KrF excimer lasers is as light sources for integrated circuit lithography. In these applications, the lasers are line narrowed to about 0.5 pm about a desired "center-line" wavelength. The laser beam is focused by a stepper or scanner machine onto the surface of a silicon wafer on which the integrated circuits are being created. The surface is illuminated with short bursts of laser pulses at pulse rates of about 1000 Hz or greater. Very precise control of wavelength and bandwidth are required to permit the production of extremely fine integrated circuit features. The operators of most stepper and scanner machines in use today operate the laser light source at about 1000 Hz, but 2000 Hz sources are being shipped and lasers with even higher repetition rates are being developed. The typical laser gas for the KrF laser is about 99 percent neon at 3 atmospheres and at a temperature of about 45° C. At this temperature a sound wave travels about 47 cm between pulses at 1000 Hz, about 23.5 cm between pules at 2000 Hz and about 11.7 cm at 4000 Hz. Integrated circuit manufacturers desire to be able to operate their laser at any pulse rate within the operating range of the laser while maintaining beam parameters including target wavelength and bandwidth within desired specifications.

Distances between the discharge region of a typical lithography excimer laser and major reflecting surfaces within the laser chamber range from about 5 to 20 cm. Distances between reflecting surfaces in planes perpendicular to the length of the discharge region are mostly between about 5 cm to about 10 cm. Therefore, as demonstrated by a comparison of FIG. 2A showing distances traveled by sound with FIG. 1, a typical discharge created pressure wave traveling at the speed of sound in the FIG. 1 laser operating at 1000 Hz would have to make several reflections in order to arrive back at the discharge region coincident with the next discharge. At pulse rates in the range of 2000 Hz and higher, the pressure wave traveling at the speed of sound may return to the discharge region coincident with the next pulse after only one reflection.

Wavelength Specifications for Lithography Lasers

KrF excimer lasers currently in use for integrated circuit lithography are designed for precise control of wavelength and bandwidth. Current specifications from integrated circuit makers call for control of the center line wavelength to a target wavelength, such as 248,321.3 pm within a stability range of ±0.1 pm. A typical bandwidth specification may be 0.6 pm, full width half maximum and 3 pm, 95% integral.

The makers of stepper and scanner machines want to tighten these specifications and also to increase pulse repetition rate to 2000 Hz and above.

A typical method of line narrowing a lithography laser is shown in FIG. 3. In this drawing the line narrowing module (called a "line narrowing package" or "LNP") 7 is greatly enlarged with respect to the rest of laser system 2. The laser beam exiting back end of laser chamber 3 is expanded with a three prism beam expander 18, and reflected by a tuning mirror 14 on to a grating 16 disposed in the Litrow configuration. The angle at which the light illuminates and is reflected from the surface of the grating determines the selected wavelength. For example, in this prior art laser a pivot of 40 micro radians produced by stepper motor 15 will change the wavelength of the selected light by 1 pm. The three prism beam expander shown in FIG. 3 increases the selectivity of the grating by its magnification factor which is typically about 25. A change in direction of the beam exiting the laser in the direction of the LNP can also cause a change in the wavelength selected by the grating; however, the direction change would need to be about 1 milliradian to cause a 1 pm change in the selected wavelength.

The wavelength of prior art lithography lasers is normally controlled with a feedback arrangement in which the wavelength of the output beam is sampled by an instrument called a wavemeter to measure the wavelength and the measured values are compared to a desired or target wavelength to compute a wavelength error value which is used to adjust the position of mirror 14. Typical prior art wavemeters for lithography lasers require about 3 milliseconds to measure the wavelength and to calculate the wavelength error. Another approximately 4 milliseconds are required by the stepper motor 15 to adjust the position of mirror 14. These prior art wavelength control techniques work well to correct wavelength drifts over periods longer than about 10–15 milliseconds.

Prior art KrF excimer lasers can be operated within very tight specifications even at very high repetition rates when operating at steady state, for example, continuously at 2000 Hz. However, typical operating modes for a lithography laser light source is far from steady state continuous. In a typical mode, 170 dies on a wafer may each be illuminated with 0.15 second bursts of laser pulses at a pulse repetition rate of 2000 Hz (i.e., 300 10-mJ pulses) with a 0.15 second down time between bursts and then a 9 second down time while a new wafer is loaded onto the machine. This complete cycle would take about 1 minute and would represent a duty cycle of about 42.5 percent.

Lasers operating in burst modes at pulse repetition rates in the range of 1000 Hz or greater have displayed patterns of wavelength variation over time periods of about 3 to 10 milliseconds with wavelength variations of about ±0.1 pm. These patterns (for the most part) have been very difficult, if not impossible to accurately predict and to date their cause has not been known. These variations are referred to as wavelength "chirp". The chirp tends to increase with increasing repetition rate. Since the time required to measure the wavelength and change the wavelength with laser controls using tuning mirror 14 driven by stepper motor 15 is about 7 milliseconds, the typical chirp is history before prior art wavelength controls take effect. Because of this latency and the inability to accurately predict the chirp patterns, it has not been feasible in the past to provide active correction of wavelength chirp with the prior art wavelength control equipment.

What is needed is an electric discharge laser having provisions for active correction of wavelength chirp.

SUMMARY OF THE INVENTION

The present invention provides equipment and methods for correcting wavelength chirp in high pulse rate gas discharge lasers. Applicants have identified the major cause of prior art wavelength chirp as pressure waves from a discharge reflecting back to the discharge region coincident with a subsequent discharge. The timing of the arrival of the pressure wave is determined by the temperature of the laser gas through which the wave is traveling. During burst mode operation, the laser gas temperature in prior art lasers changes by several degrees over periods of a few milliseconds. These changing temperatures change the location of the coincident pressure waves from pulse to pulse within the discharge region causing a variation in the pressure of the laser gas which in turn affects the index of refraction of the discharge region causing the laser beam exiting the rear of the laser to slightly change direction. This change in beam direction causes the grating in the LNP to reflect back to the discharge region light at a slightly different wavelength causing the wavelength chirp.

The chirp problem can be minimized by moderating or dispersing the discharge created pressure waves or by maintaining the gas temperature as close as feasible to constant values (pulse-to-pulse). This application discloses techniques for moderating and dispensing these pressure waves. In some lasers small predictable patterns remain which can be substantially corrected with active wavelength control using relatively slow wavelength control instruments of the prior art. In a preferred embodiment a simple learning algorithm is described to allow advance tuning mirror adjustment in anticipation of the learned chirp pattern. Embodiments include stepper motors having very fine adjustments so that size of tuning steps are substantially reduced for more precise tuning. However, complete elimination of wavelength chirp is normally not feasible with structural changes in the laser chamber and advance tuning; therefore, Applicants have developed equipment and techniques for very fast active chirp correction. Improved techniques include a combination of a relatively slow stepper motor and a very fast piezoelectric driver. In another preferred embodiment chirp correction is made on a pulse-to-pulse basis where the wavelength of one pulse is measured and the wavelength of the next pulse is corrected based on the measurement. This correction technique is able to function at repetition rates as rapid as 2000 Hz and greater.

Very fast tuning mirror controls are provided for adjusting the pivot position of the tuning mirror which changes the angle of illumination on the wavelength selecting grating in the line narrowing package. These controls permit mirror tuning in a small fraction of the time interval between pulses at pulse repetition rates of 2000 Hz. This application also discloses improvements to a prior art wavemeter which permits collection of wavelength data and calculation of wavelength of each pulse in time to make wavelength tuning correction for the next pulse at pulse repetition rates of 2000 Hz or greater.

Thus, this specification discloses techniques and structured improvements to minimize chirp and also active wavelength correction techniques to correct for chirp which remains.

BRIEF DESCRIPTION OF THE DRAWINGS

FIG. 1 shows the cross section a prior art lithography laser chamber.

FIG. 2A shows distances traveled by sound between laser pulses at various pulse repetition rates.

FIG. 2B shows the change in sound speed with temperature.

FIGS. 11A, 11B, 11B1, 11B2, 11D1 and 11D2 show details of saw-tooth baffle technique for dispersing pressure waves.

FIGS. 11C1 through 11C4 show the effects of the baffle technique.

DETAILED DESCRIPTION OF PREFERRED EMBODIMENTS

Applicants' Experiments

Applicants suspected that wavelength chirp was caused by changes in laser gas temperature which in turn affected the speed at which pressure waves traveled through the laser chamber and thus the timing of the return of reflected pressure waves to the discharge region.

To test this theory Applicants operated a laser at a very low duty cycle mode (100-pulse at 2000 Hz followed by 5 seconds off) with the chamber water lines disconnected and the chamber heater disabled. Both the cooling water and heater were disabled to allow slow and uniform changing of the chamber temperature. The chamber temperature was controlled by changing the room temperature and by placing a floor fan several feet from the frame. The power imparted to the gas by the blower provided sufficient heat to warm the chamber as high as 60° C. and the floor fan provided sufficient cooling to drop the chamber temperature to 39° C. The heating and cooling of the chamber took place over a period of several hours in order to minimize any effects due to dT/dt.

From data collected the average energy for a burst, the energy variation for a burst, the wavelength burst transient, and the standard deviation of the line-center variation (called "wavelength sigma") were calculated. To provide a single data point able to quantify the line-center burst transient, a "wavelength burst transient" was defined as the difference between the average line-center wavelength of the first 30 pulses and the average line-center wavelength of the last 30 pulses in each burst. Since the wavemeter of the laser used provided data at 1000 Hz, these averages consist of only 15 unique wavelength transient values. The average of the last 30 pulses was used as a measure of the steady state line-center wavelength.

The chamber temperature was allowed to slowly vary between its extremes of about 40° C. to about 55° C. while the parameters described above were continuously monitored. All four of the measured parameters changed substantially as the chamber temperature decreased. Pulse energy generally decreased (with some small up and down variation) with decreasing temperature but the other three parameters increased and decreased substantially over the temperature range.

Figure 4A:
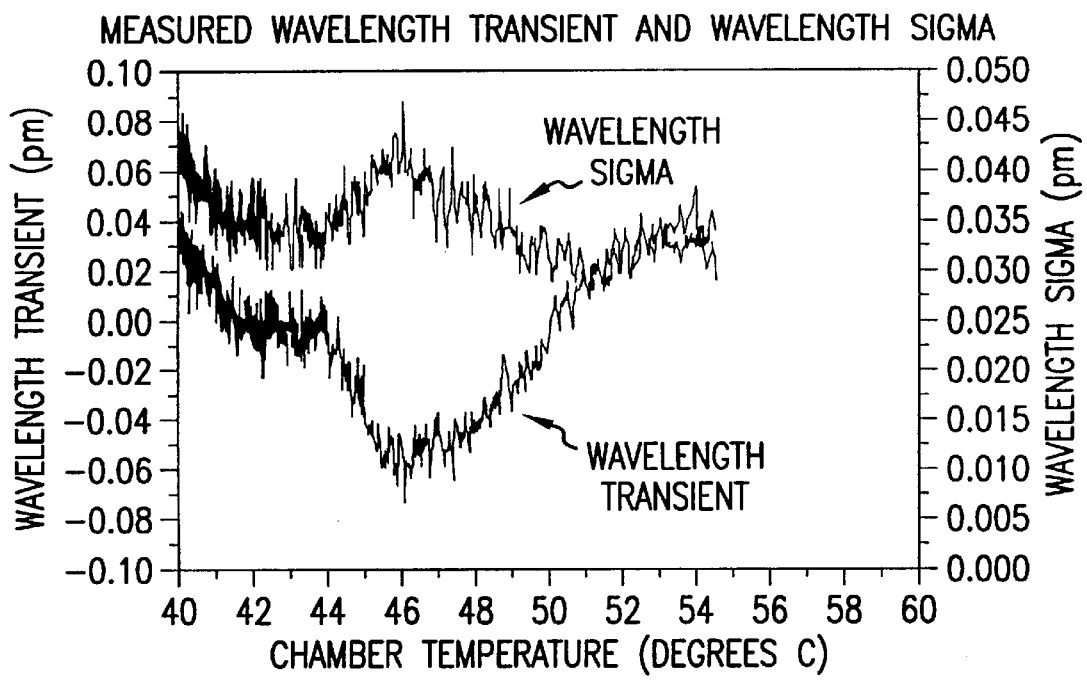
FIGS. 4A and 4B show variation of wavelength sigma and wavelength transient with laser gas temperature.
Figure 4B:
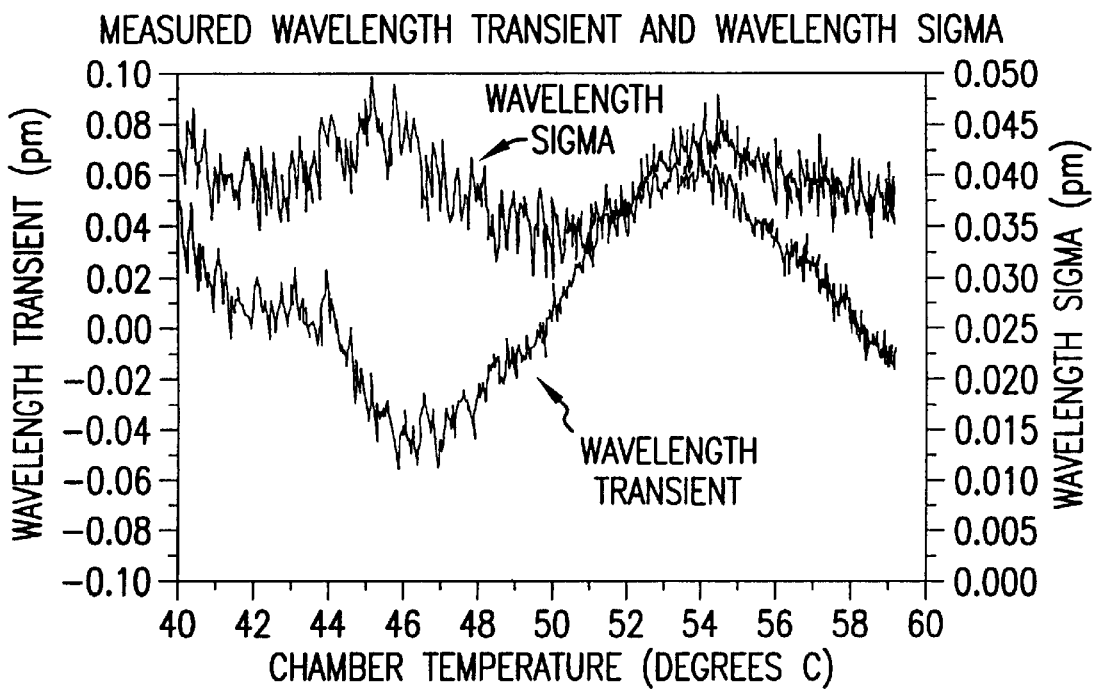
Figure 5A:
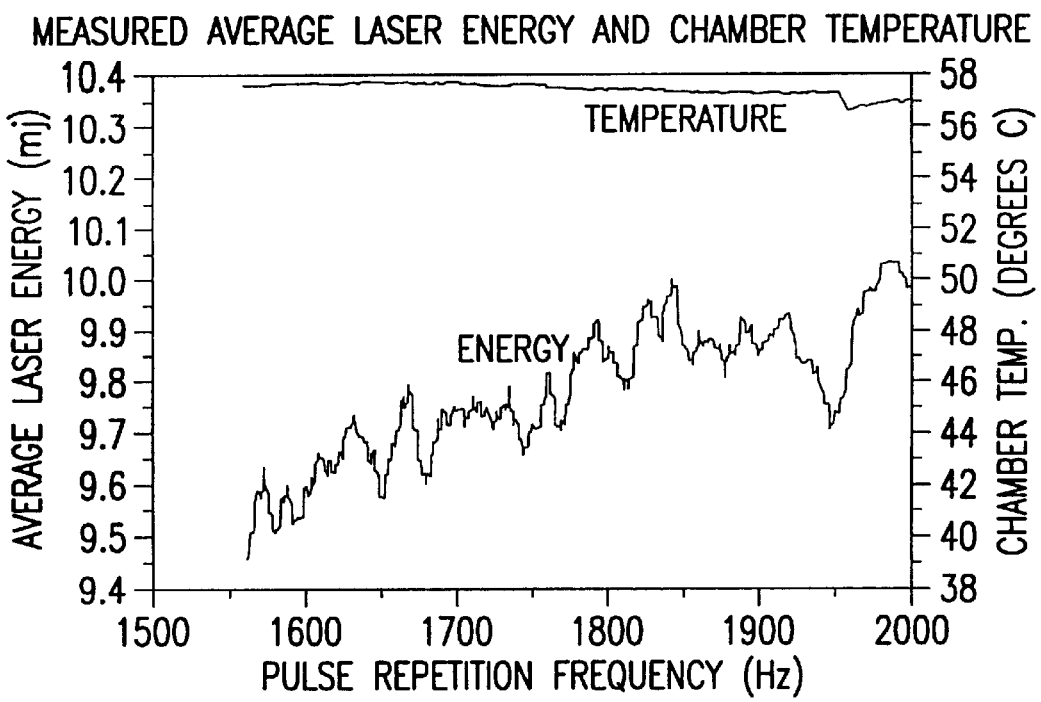
FIGS. 5A through 8B show variation of beam parameters with pulse repetition rate at two substantially different temperatures.
Figure 5B:
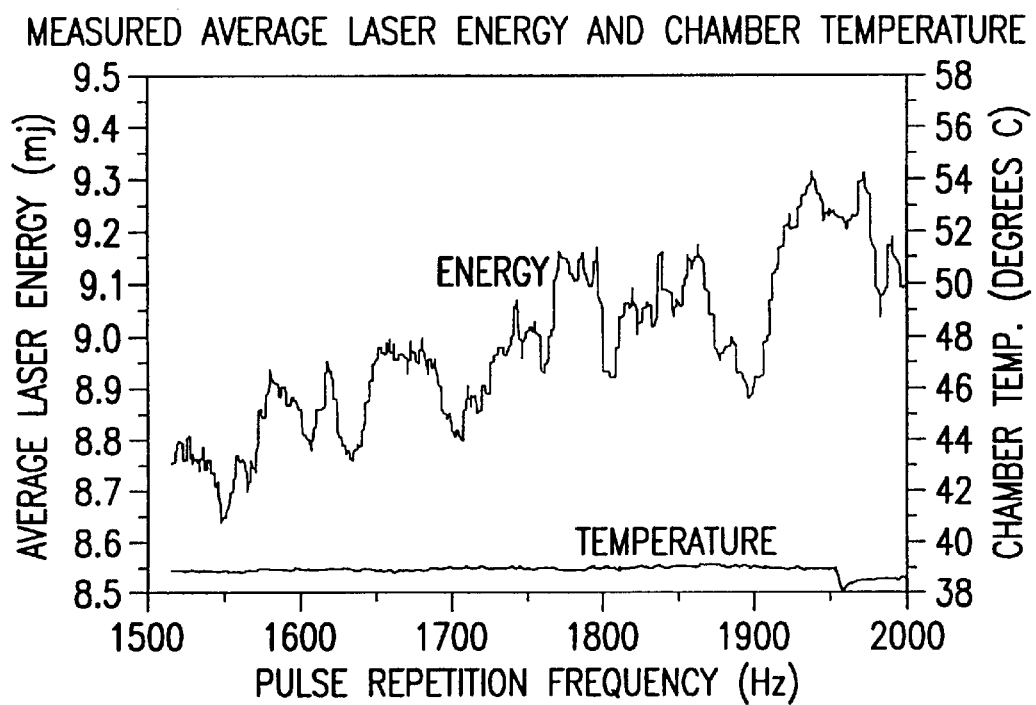
Figure 6A:
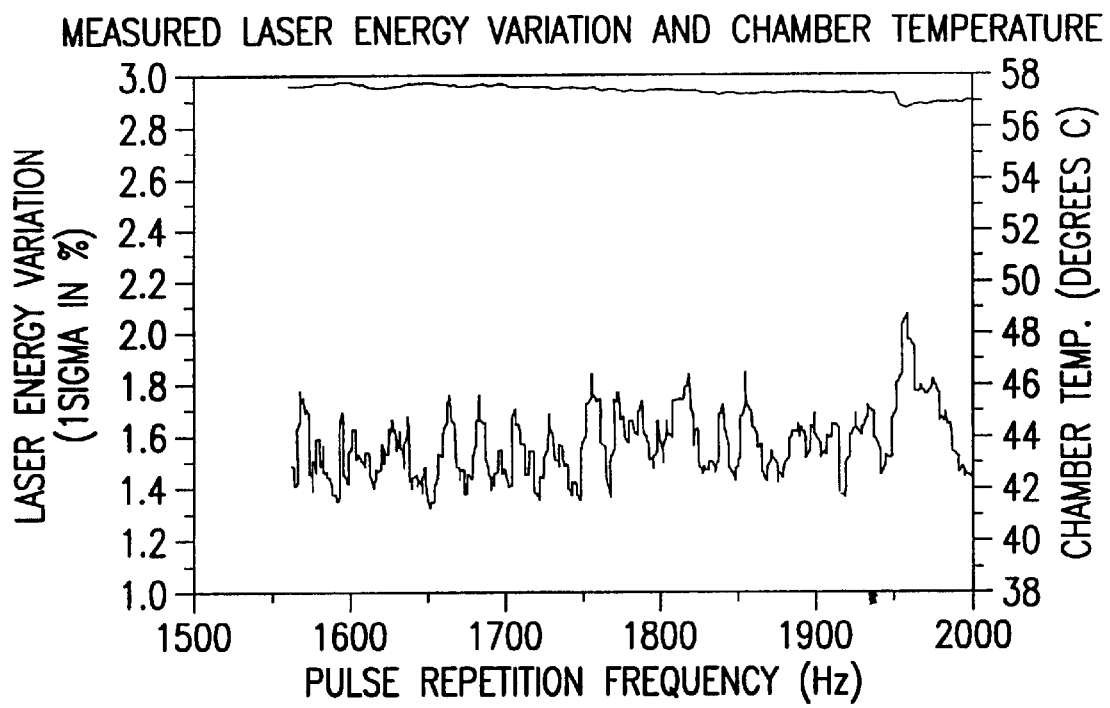
Figure 6B:
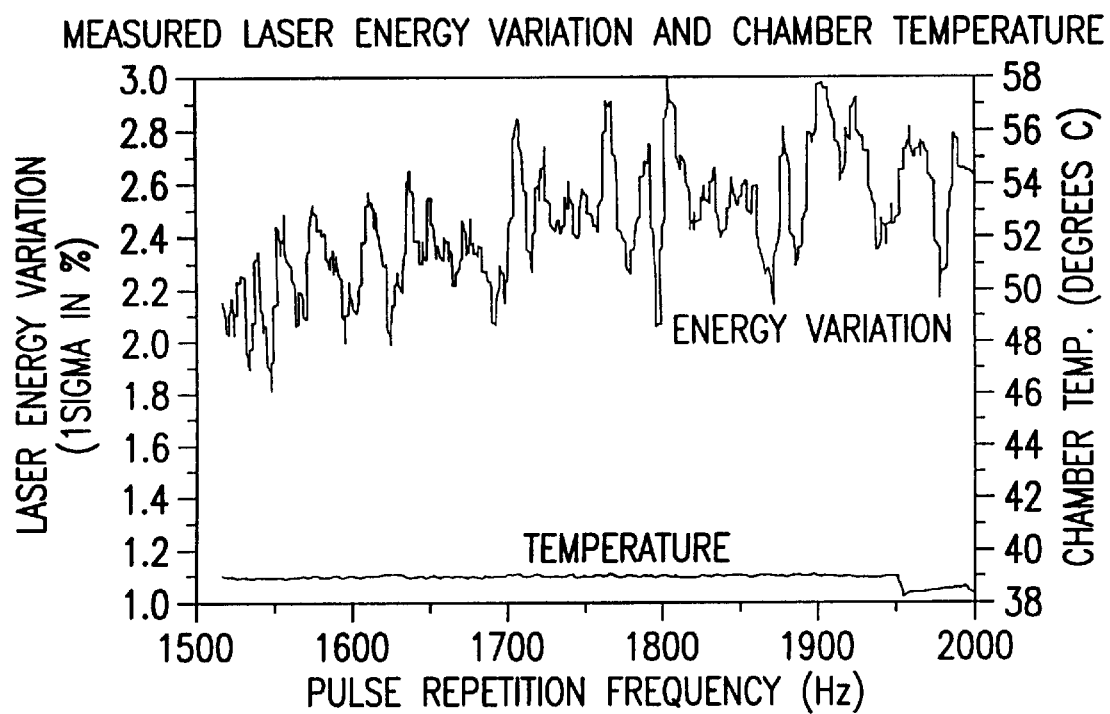

By plotting wavelength burst transient and wavelength sigma vs. chamber temperature we see that these characteristics vary with chamber temperature in a stable and repeatable manner. FIG. 4A shows the data taken during cool down and FIG. 4B shows the data taken during warm up.

Once a temperature sensitivity had been established with repeatable measurement results, the next question to answer was, in what way does chamber temperature impact wavelength transient? Variations with temperature on this order have been found in the past with other laser parameters, most notably laser energy. If wavelength transient is impacted in similar ways as the laser energy, then acoustic effects might be a significant factor. Since the speed of sound in a gas depends on the square root of temperature, a display of this type of relationship would indicate an acoustical cause.

Applicants then operated the laser over a range of laser repetition rates at two substantially difference chamber temperatures and compared the resulting curves.

The same four parameters as before were measured versus repetition rate and are shown for a high temperature of approximately 57° C. in FIGS. 5A, 6A, 7A and 8A. The lower temperature data is shown in FIGS. 5B, 6B, 7B and 8B for a temperature of approximately 39° C. Each of the figures show a rich structure and variations with repetition rate and a few Hz can lead to significant changes in plotted parameters.

Figure 7A:
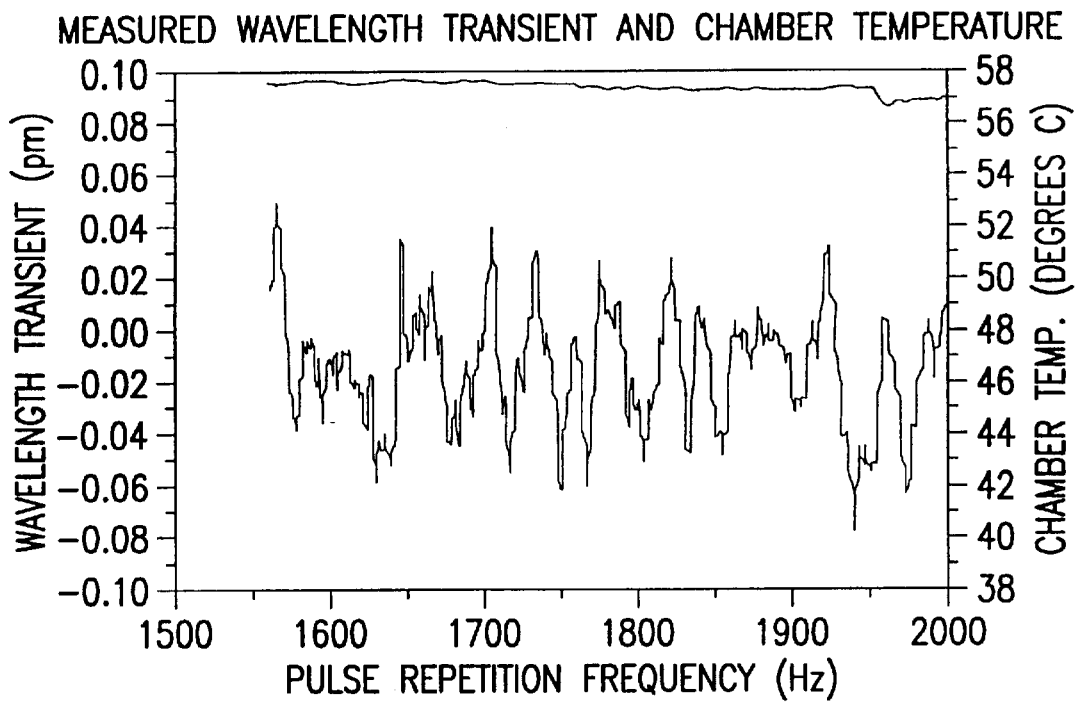
Figure 7B:
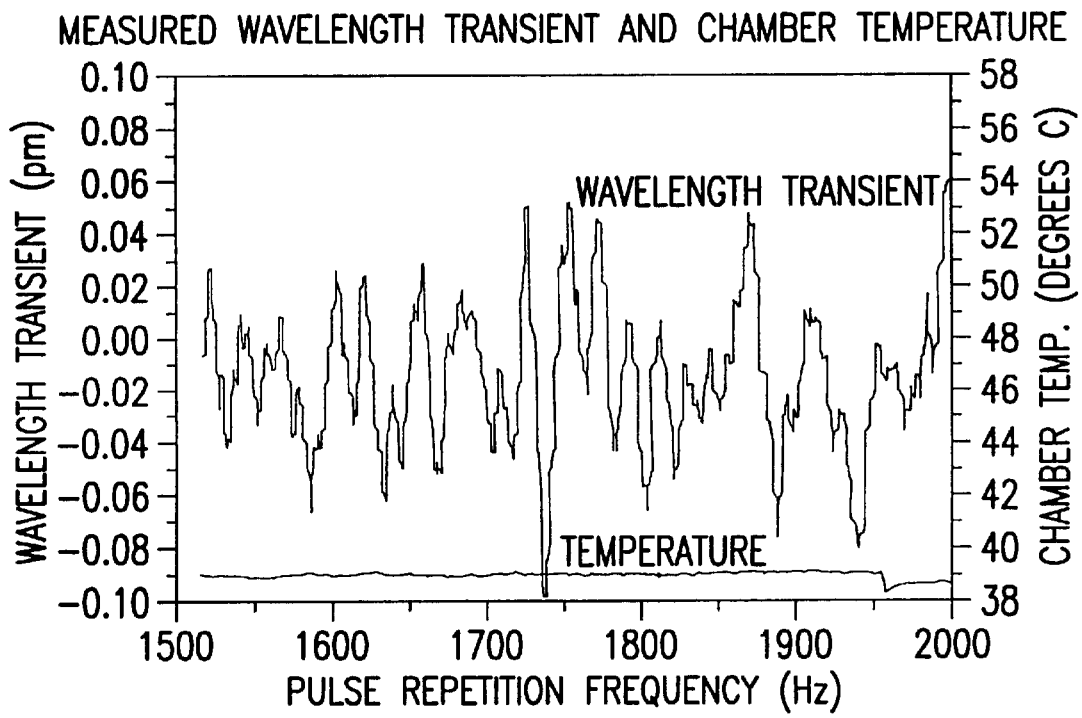
Figure 8A:
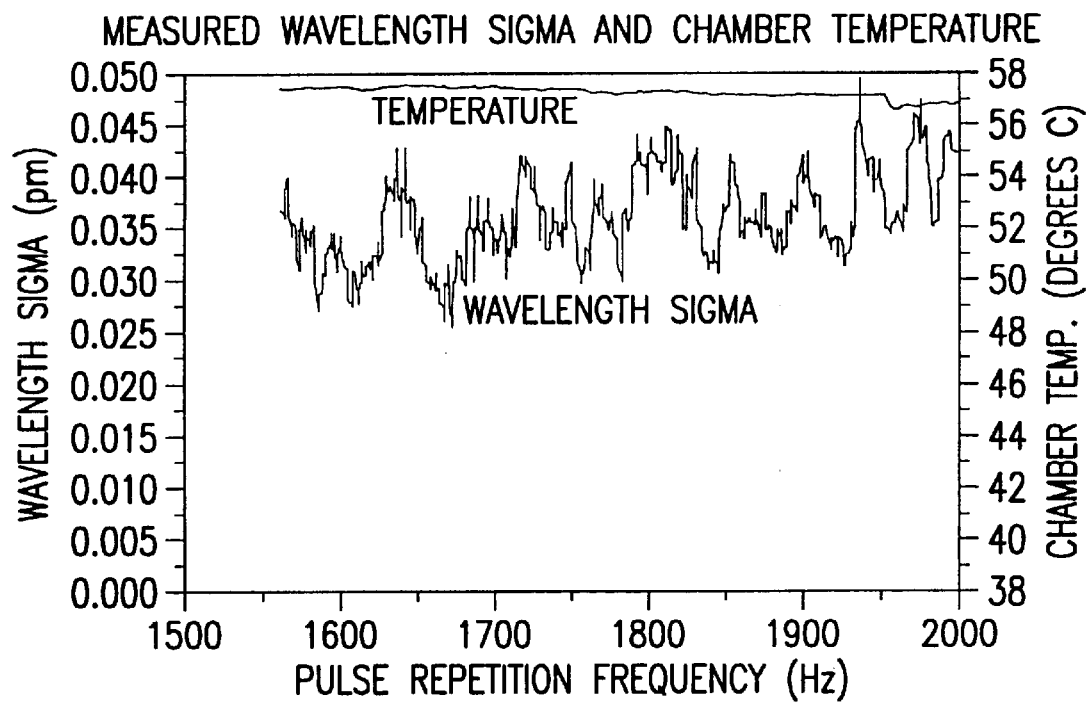
Figure 8B:
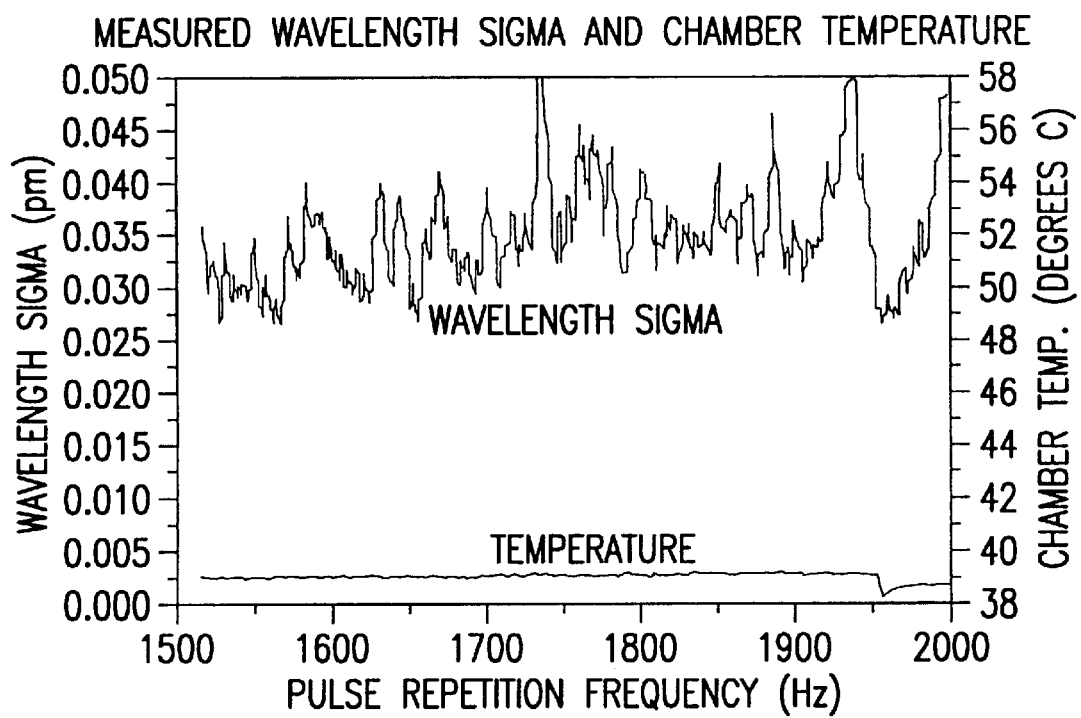
Figure 9A:
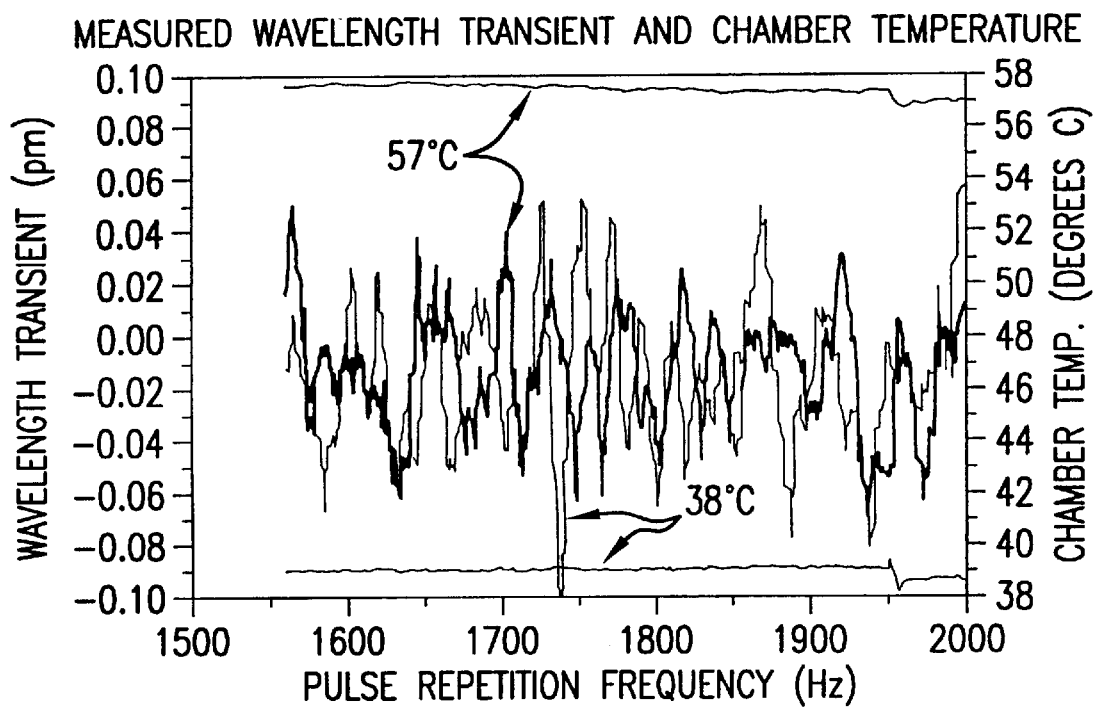
FIGS. 9A and 9B compare wavelength transient versus pulse repetition rate curves at the two different temperatures.

To see if these variations with repetition rate are acoustic related the data could be plotted with the lower temperature data shifted appropriately. But first Applicants plotted the two data sets together with no shifting. FIG. 9A shows FIGS. 7A and 7B plotted together (the thicker plot representing the 57° data. The result is no apparent correlation.

Figure 9B:
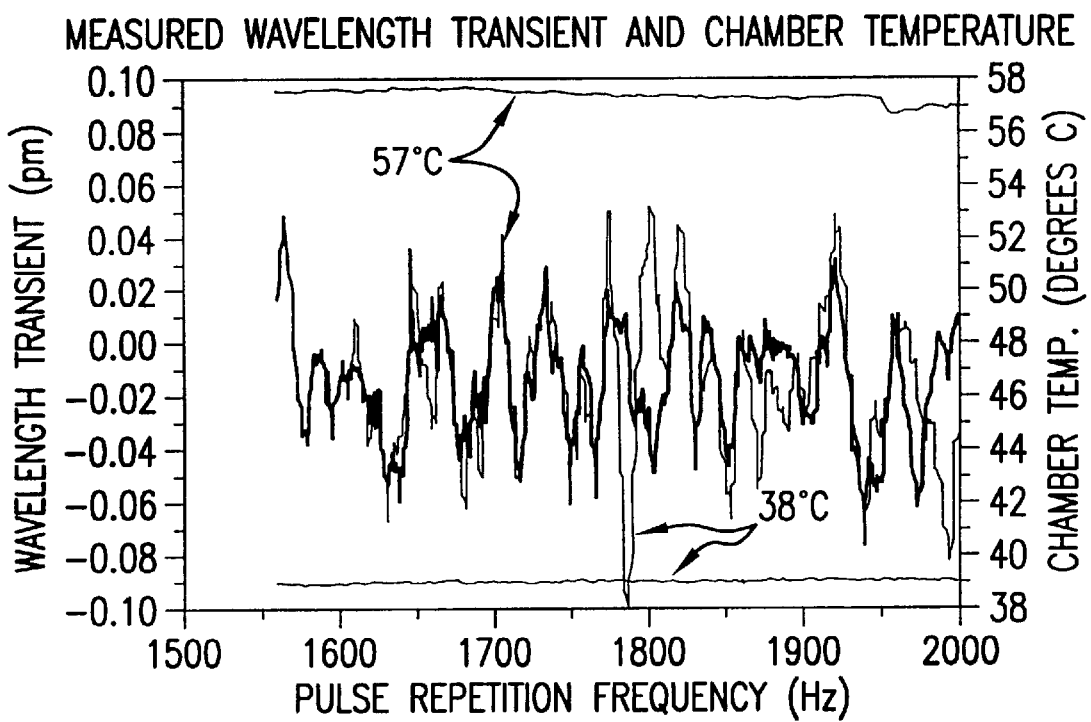

The comparison after making the shift due to the difference in the speed of sound is as shown in FIG. 9B. This was done by plotting the 39° C. data at repetition rates increased by the ratio of:

$$\sqrt{330\,K}/\sqrt{312\,K}$$

The shift for temperature is actually quite small, only 2.8%, but when applied to the lower temperature data virtually all of the structure matches between the two data sets. There are only three significant peaks that differ between the two sets. These features may be due to another phenomenon or they are still may be acoustical but are due to a coincident combinations of several reflections from different distances that occur at one temperature but do not at the other.

The data presented in FIGS. 4A through 9B show that the wavelength transient occurring at the beginning of a burst can be dramatically impacted by acoustic interaction with the chamber. This data also shows that it might be difficult to attempt to find a "sweet spot" for low transient since only a few degrees of temperature change or a few Hz of repetition rate change cause a large shift in the transient. The situation becomes even more complicated when the heat exchanger and chamber heater are active, creating spatial temperature gradients and fast dT/dt events.

Temperature Variation During Burst Mode Operation

During the second half of a 300 pulse burst the laser is close to steady state conditions, but during the first approximately 60 pulses of each burst the condition of the laser is far from steady state. The discharge region between the electrodes 10 and 12 is a volume about 20 mm high 4 mm high and 80 cm long. During a discharge about 2 J of electrical energy is deposited in this volume of gas which is about 99% neon at 3 atmospheres at an initial temperature of, for example, about 50° C. The discharge occurs in a very short time period of about 40 ns which initiates a violent pressure wave which travels out at about the speed of sound (about 470 m/s) from the discharge region through the circulating gas.

Figure 1A:
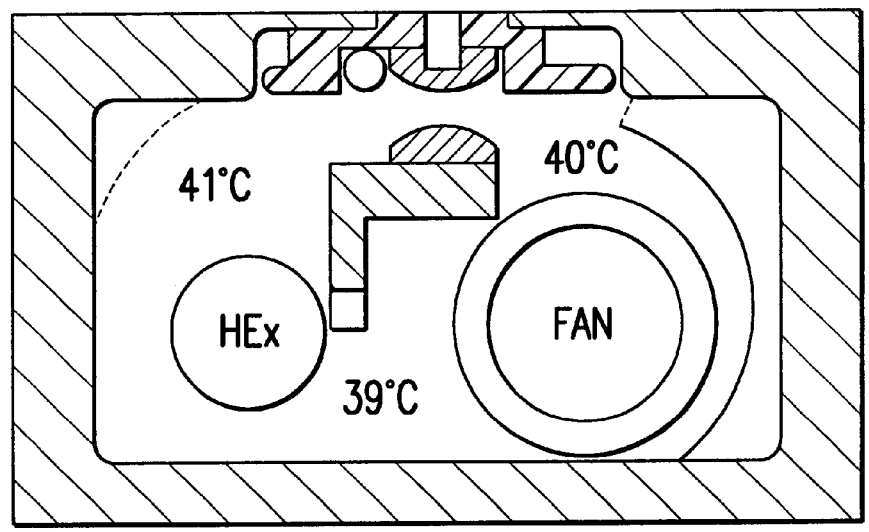
FIGS. 1A through 1F show temperature changes in the laser gas during a burst of pulses.
Figure 1B:
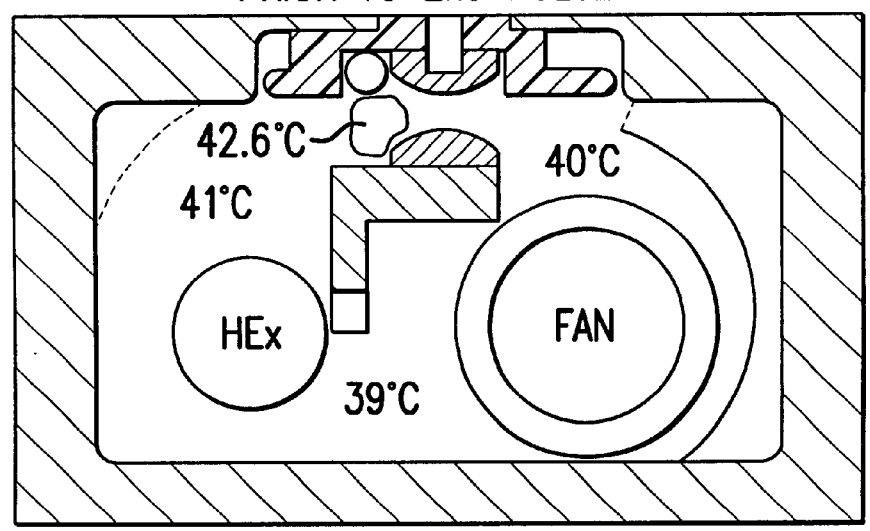

The 2 J of energy also increases the temperature of a slug of gas in the immediate vicinity of the discharge which move slowly out of the discharge region at the speed of the circulating gas, about 40 m/s. The heated slug is initially about the size of the discharge volume (about 70 cm×0.4 cm×2 cm). This volume is heated about 20° C. to, in this qualitative example, about 60° C., and it expands relatively slowly. The relatively slowly expanding slug of heated gas is pushed out from between the electrodes by the circulating gas so that, with the laser operating at 2 kHz, the heated slug now at an average temperature of about 42.6° C. from a given pulse is centered about 2 cm downstream of the electrode as shown in FIG. 1B at the time of the next pulse.

At typical blower speeds for a 2 kHz lithography laser such as the one shown in FIG. 1, the laser gas makes a complete loop around the chamber in about 30 milliseconds. For a one minute, 42.5 percent duty cycle of the type described above (i.e., 170 short bursts of 300 pulses at 2000 Hz followed by a 9 second down time), the discharge will be adding heat to the gas at an average rate of about 1.7 kw (about 2 J per pulse). The fan adds heat at a substantially constant rate of about 500 W and the heat exchanger removes the large majority of the heat added by the discharge and the fan at an approximately constant rate over the 1-minute duty cycle.

Figure 1C:
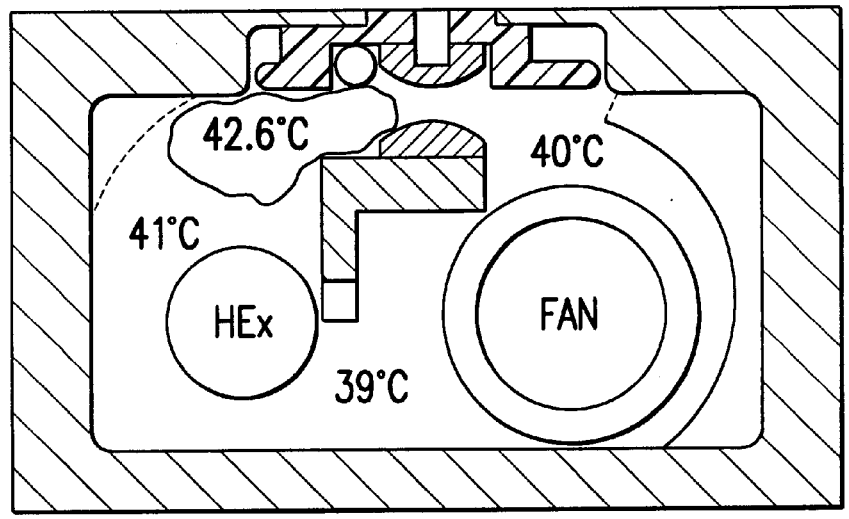
Figure 1D:
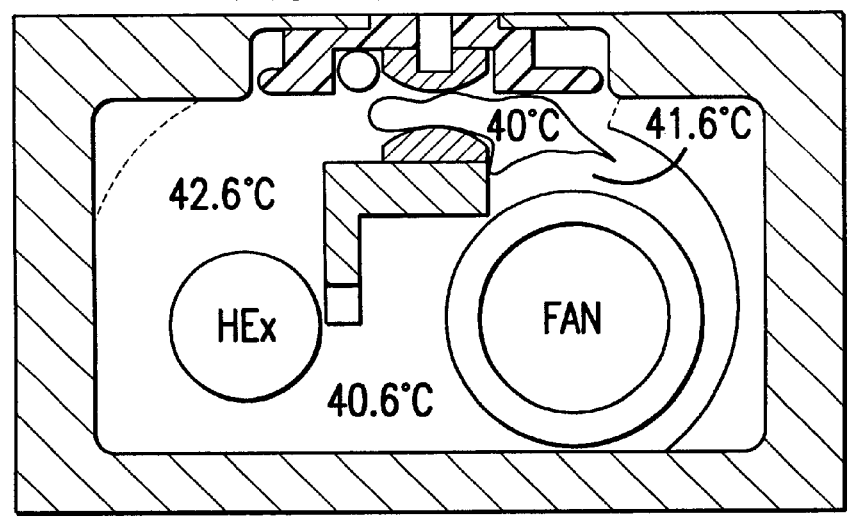
Figure 1E:
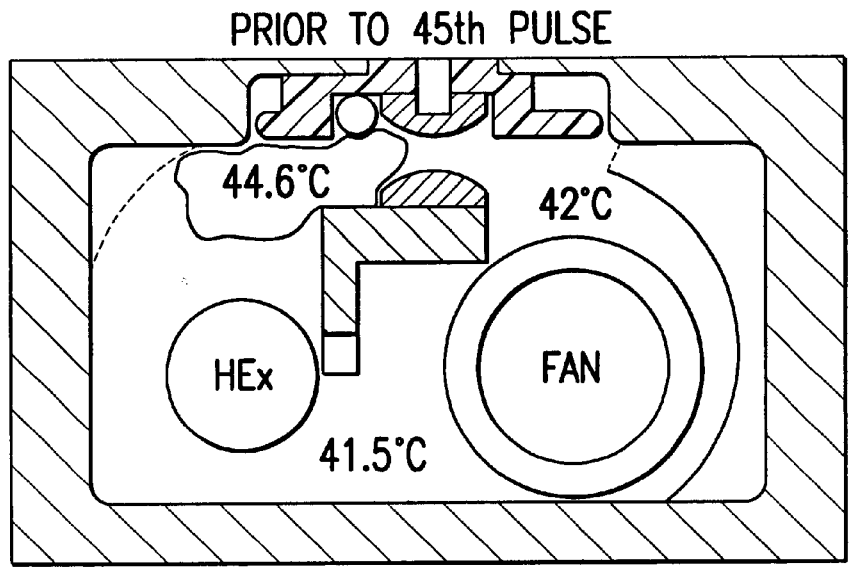
Figure 1F:
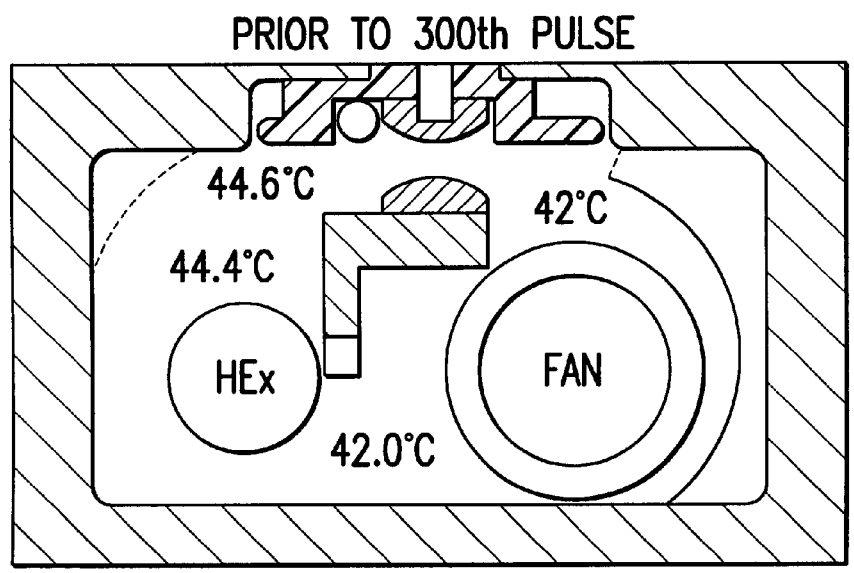

Controls on the laser cooling system are set to maintain average gas temperatures as closely as feasible to a constant temperature such as about 44° C. However, since heat is added periodically (during extremely short time periods) between the electrodes and removed at the heat exchanger, gas temperatures vary substantially within the chamber. For example, the gas temperature in the chamber prior to the first pulse of a 300 pulse burst after the 9 second down time will be relatively constant throughout the chamber at (for example) about 40° C. (with a small step temperature gradient across the heat exchanger). At this time heat is being extracted from the gas by heat exchanger 40 and added to the gas by the (at this time) somewhat warmer walls and other structures of the chamber. A rough estimate of the temperature distribution is shown in FIG. 1A. Just prior to the second pulse the gas temperature for a distance of about 4 cm downstream of the electrodes will be about 42° C. but the gas temperature upstream will continue to be about 40° C. as indicated in FIG. 1B. Just prior to the next approximately 40 pulses, the gas temperature between and upstream of the electrode will continue to be about 40° C. and the gas temperature downstream will continue to be about 42.6° C. but the volume of 42.6° C. gas will grow as the heated slugs of laser gas circulate around the laser. FIG. 1C shows a rough estimate of the gas temperature just prior to the fifth pulse. At about the $35^{th}$ to $40^{th}$ pulse the upstream temperature of the gas will begin to be affected by the first pulses of the burst and the upstream temperature will increase to about 42° C. as indicated in FIG. 1D. When the gas from the first pulse passes through the electrodes for the second time it will be about 2° C. higher at about 42° C. and will receive about the same amount of heat as the first burst and its temperature be increased to about 44.6° C. and for about 35 to 40 pulses the upstream and downstream temperatures will remain relatively constant at about 42° C. and 44.6° C. as indicated in FIG. 2E, after which both upstream and downstream will see another small incremental temperature increase. This process continues with the incremental increases becoming slightly smaller each approximately 40 pulses so that just prior to the last pulse of the first 300 pulse burst the upstream temperature is about 42° C. and the downstream temperature is about 44.6° C. Immediately following the first burst is a down time of 0.15 second during which time the laser gas temperature downstream of the electrode decreases to approximately the upstream temperature of about 42° C. and then over the next 0.15 seconds the average temperature of the gas is reduced by the heat exchanger by about 2° C. (The reader should keep in mind that the temperature changes shown qualitatively in FIGS. 1A through 1F occur very rapidly during one 300 pulse burst lasting only 0.15 second.)

The first pulse of the second burst will again cause an approximately 2.6° C. increase in a small volume downstream of the electrode which heated volume grows with each of the first few pulses of the second burst. The upstream temperature will again begin to increase about 35 to 40 pulses later as explained above with additional increases affected by the first pulses of the burst and the upstream temperature will increase to about 42° C. When the gas from the first pulse passes through the electrodes for the second time receiving about the same amount of heat as the first burst, it will be increased to about 44.6° C. and for about 35 to 40 pulses the upstream and downstream temperatures will remain relatively constant at about 42° C. and 44.6° C. after which both upstream and downstream will see another small incremental temperature increase. This process continues in the manner explained with respect to the first burst.

Figure 2C:
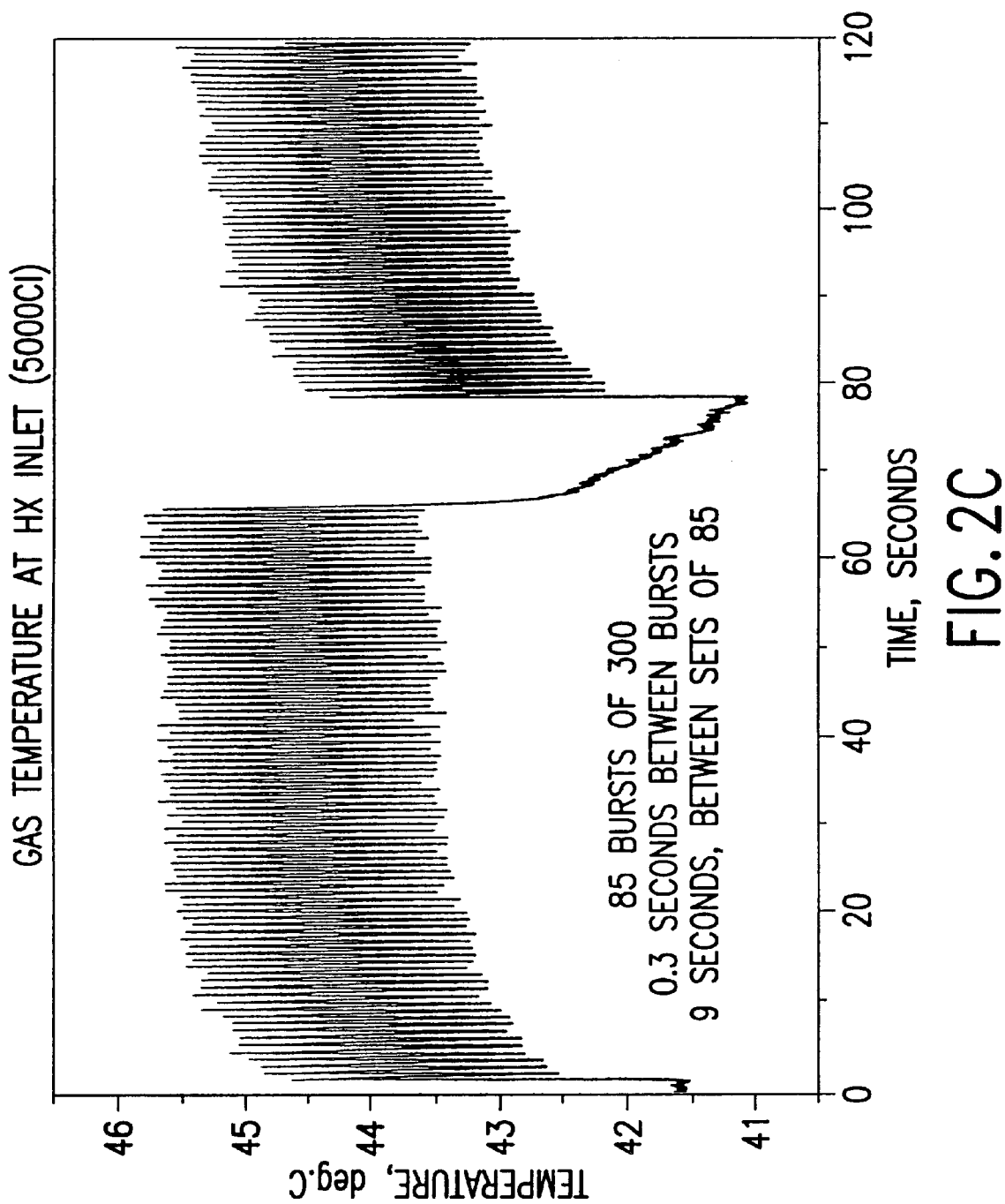
FIG. 2C is a chart showing temperature swings during pulse mode operation.

Similar temperature changes occur during each of the 170 bursts required to process a single wafer in a time period of about 51 seconds. During this time the average gas temperature will drift upward by about 3° C. and after the last pulse of the $170^{th}$ burst there is a 9 second down time to change wafers when the average gas temperature drops about 5° C. to about 41° C. (where we started). FIG. 2C shows a temperature tracing of a very fast thermocouple-located just upstream of the heat exchanger in a laser being operated at 1000 Hz with 0.3 seconds between bursts and a down time of 9 seconds after 85 bursts.

Temperature Effects on Returning Pressure Wave Position

Thus, during a one minute cycle of operation of a lithography laser there are very rapid small incremental changes in the laser gas temperature. In the past these small temperature changes have not been considered particularly important because the changes were considered too small to have any direct effect on the discharge, the chemistry of the laser gas or the optical properties in the laser discharge region. Applicants have discovered, however, that these small temperature changes can have a very major indirect effect on laser beam quality due to the effect of temperature on the speed of discharge-caused pressure waves (sound and shock waves) in the laser when the laser is operated at very high repetition rates such as rates in excess of 1000 Hz. The relationship of the speed of sound in the KrF (mostly neon) laser gas with temperature is shown in FIG. 2B. The relationship is a square root relationship but it is almost linear in the operating range of the laser. From FIG. 2B, a 1° C. increase in the neon temperature increases the sound speed by about 0.8 m/s. Therefore, the approximately 3° C. increase in the downstream gas temperature occurring during the first approximately 5 milliseconds following the start of a burst will increase by about 2.4 m/second the speed at which the echo from the pressure wave of a particular pulse returns to the discharge region.

The time of return of pressure wave echoes can be very important since Applicants' tests have shown the pressure wave has a thickness (of the pressure front) of about 4 mm or about the thickness of the approximately 4 mm discharge region. The difference between the low pressure part of the wave and the high pressure part is about 0.03 to 0.07 atm or about 1 to 2% of the chamber pressure. If a pressure wave echoes back through the discharge region at any time other than during the approximately 40 ns time period of a subsequent pulse, it causes no problem. The problem is caused when a returning pressure wave in a high pulse rate laser from a particular discharge passes through the discharge region at the exact time of the subsequent pulse. If the echo pulse is exactly centered over the discharge region, the low pressure portion would be on one side of the region and the high pressure portion would be on the other. The result is a gas pressure such as 3.015 atm on one side of the discharge region and 2.985 atm on the other side.

The index of refraction of the mostly neon laser gas at 3 atm is about 1.000201. A 1% gradient in pressure across the discharge region would result in an index of about 1.000202 on one side of the region and 1.000200 on the other side. This would have the effect of signifcantly changing the direction of the laser beam exiting the laser. Thus, Applicants have determined that these pressure waves are probably responsible for a large portion of the ±0.1 pm wavelength chirps actually seen during burst mode operation.

Pulse Energy Chirp and Wavelength Chirp During Burst Mode Operation

For several years users of lithography excimer lasers have observed minor variations in laser beam parameters, especially pulse energy and wavelength, during burst mode operation. The largest of variations usually, but not always, occur at the beginning of a burst and/or at about one circulation time (about 30 ms for a 1000 Hz laser) after the start of a burst.

These "chirp" variations have seemed to follow patterns but the patterns were difficult to predict and were different for different laser chambers and operation conditions. There has been much speculation as to the cause or causes of these variations but no firm agreement as to the cause.

The energy chirp problem has been dealt with primarily in two ways with the laser energy control system. First, the energy control system for the laser is so fast that the pulse energy of a given pulse can be adjusted with a feedback technique based on the measured energy of earlier pulses including the immediately preceding pulse. Second, the computer controller has been taught to learn the pattern of the energy chirp and to make adjustments to the discharge voltage taking those patterns into consideration in order to produce the desired individual pulse energies and total "dose" energy in a burst. A process for processing active control of energy chirp is described in U.S. Pat. No. 6,005,879 which is incorporated herein by reference.

Active control of wavelength chirp is more difficult because the measurement of wavelength takes longer than the energy measurement and because currently used wavelength tuning mechanisms are slower than discharge voltage controls. Also in the past the wavelength chirp has been more erratic and less predictable than the energy chirp. However, based on Applicants' discovery of the cause of a major cause of the most erradic portion of the chirp, Applicants have been able to devise methods of minimizing the chirp by modifications inside the laser chamber to reduce the impact of pressure waves crossing the discharge region. This has left a more defined and predictable chirp that is much more susceptible to active control. Both the structural modification and the active control techniques are described below.

How Much Difference A Degree Makes

As shown in FIGS. 1A through 1F, temperature swings of about 2 to 3° C. occur in the laser gas on time scales of a few milliseconds, such as about 5 milliseconds. Chirp variations also are in the range of a few milliseconds. Suppose a laser is operating at a pulse frequency of 2000 Hz. The distance sound would travel in laser gas between pulses (466 m/s) at 45° C. is about 23.30 cm. The distance sound would travel in the laser gas between pulses (467.6 m/s) at 47° C. is about 23.38 cm. Therefore, if the laser gas downstream of the electrodes is at a temperature of 45° C. and the pressure wave returning from the immediately preceding pulse is located immediately downstream of the discharge region (and causing no perturbation of the beam) an increase in the gas temperature to 47° C. will position the edge of the pressure wave approximately 0.8 mm into the discharge region. Another 2° C. rise will move the edge of the wave almost to the middle of the discharge region.

Thus, at 2000 Hz, the position of returning pressure waves from the immediately preceding pulse is moved about 0.8 mm for each 2° C. of temperature change. At 1000 Hz the position of the pressure wave is moved about 0.8 mm for each 1° C. temperature change. For pressure waves returning from pulses earlier than the immediately preceding pulse the position change is proportionally larger.

Mitigation of Pressure Waves

Many techniques can be used to mitigate the effects of pressure waves. Several such techniques are described in U.S. Pat. No. 5,978,405 which has been incorporated herein by reference. These include angled reflectors, such as those shown in FIGS. 5A through 5D of that patent, positioned to reflect the pressure waves downward into the bottom of the chamber.

Saw-Toothed Baffles with Varied Shaped Teeth

A first preferred embodiment of the present invention is shown in FIGS. 11A and 11B. FIG. 11A shows a cross-section of a laser chamber with baffles attached by screws to the chamber walls at positions 60, 62, 64 and in the upper corners as shown at 66 and 68. The baffles have a cross section which is saw-tooth shaped with varying shaped teeth as shown in FIG. 11B which is an end view of baffle 60.

As indicated in detail views of portions of baffle 60 (FIG. 11B1 and FIG. 11B2), the pitch of the teeth vary from 0.390 inch to 0.590 inch and the height of the teeth vary from 0.120 inch to 0.280 inch. The teeth are aligned generally in the direction of gas flow and perpendicular to the laser beam direction and the long dimension of the discharge region. In this preferred embodiment the baffled material is 20 gage nickel plated aluminum sheet. This baffle design is very effective in dispersing the discharge produced pressure waves. This design reflects the waves in a great number of directions with minimum reflection in directions perpendicular to the long direction of the discharge region. The result is that if and when acoustic energy from any particular pulse returns to the discharge region, the energy (or pressure perturbation) of the wave is fractionalized into a very large number of pieces.

Figure 3:
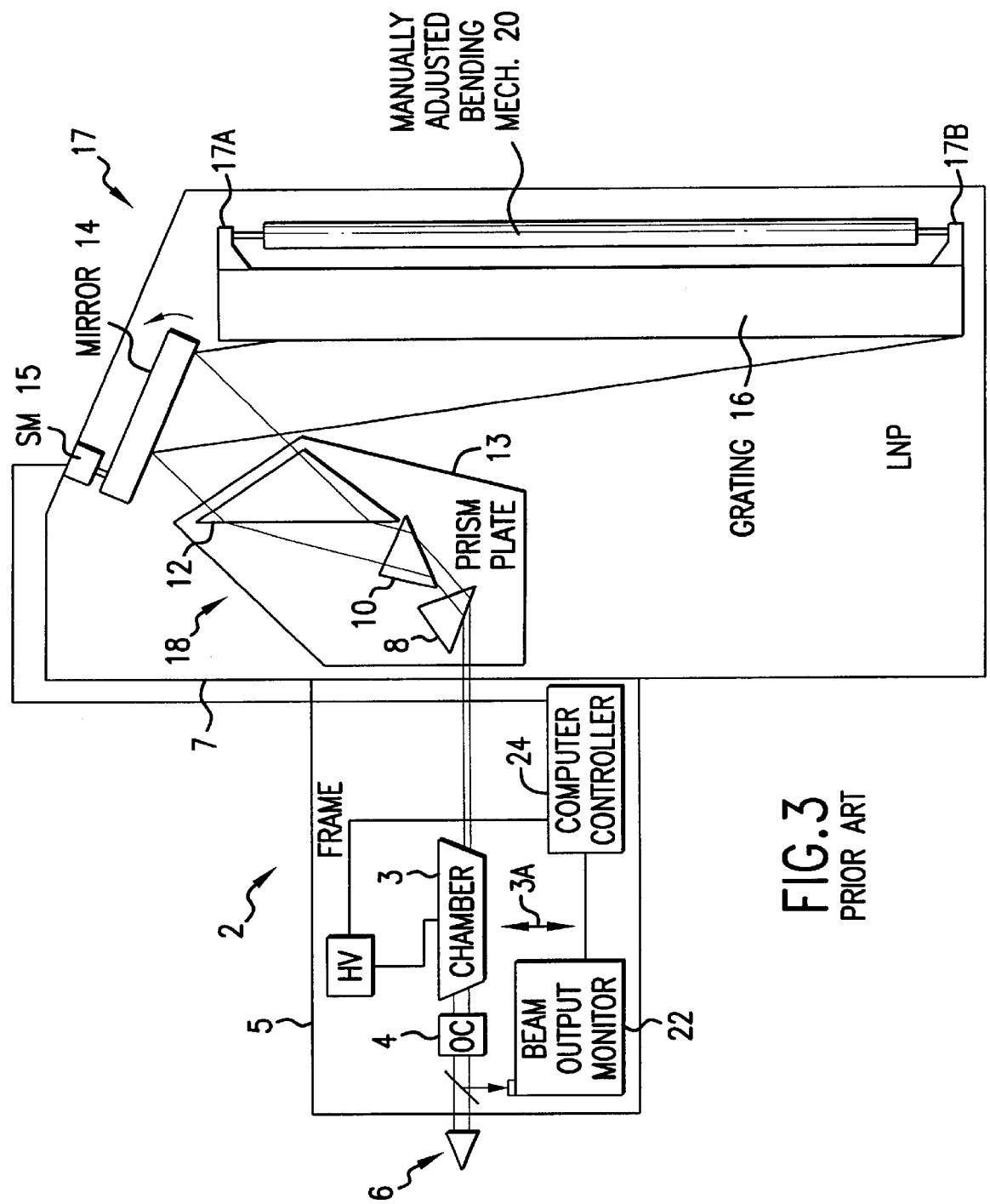
FIG. 3 shows how the wavelength of a lithography laser is controlled.

FIG. 11C1 through 11C4 show the results of tests conducted by Applicants in which Applicants lined the walls generally as shown in FIG. 11A with aluminum plate formed as generally shown in FIG. 11B but without the precision specified in FIG. 11B. The result from this test as shown in FIG. 11C2 is about a factor of two improvements in the wavelength perturbation as compared to the data shown in FIG. 11C1 which was obtained using a chamber of the design shown in FIG. 1 which include angled metal diffuser plates located in the corner above the heat exchanger and above the fan baffle. The only major perturbation occurs at about 1940 Hz. This large perturbation at about 1940 Hz was greatly reduced as shown in FIG. 11C3 by putting baffles generally shaped as shown in FIGS. 11B, 11B1 and 11B2 on the upper half of the downstream side walls as shown at 70. Further improvement resulted from mounting similar baffles 72 on the upstream side walls as shown in FIG. 11C4.

The reader should note that in FIGS. 11C1 through 11C4, wavelength transient data are plotted. These plotted values represent the difference between the average line center wavelength of the first 30 pulses and the average line center wavelength of the last 30 pulses of a 100 pulse burst. For this laser with the baffle arrangement described above and in FIG. 11C4, almost all of the data points fall within a range of about ±0.02 pm, an amazing improvement as compared to the data shown in FIG. 11C1. The reader should also note that the first thirty pulses (representing the first 15 milliseconds of the burst at 2000 Hz and the first 20 milliseconds the burst at 1500 Hz) are on the average at a wavelength about 0.026 pm lower than the equilibrium wavelength for the bursts. In general the normal burst pattern is for the wavelength to dip to a low point at about 7 to 10 ms after the start of a burst then increase gradually. After about 20 milliseconds, the centerline wavelength (on the average) is substantially at equilibrium (i.e., centered at 0.0 pm). The average could be shifted up to about zero by pretuning mirror 14 for the first approximately 7 to 10 milliseconds of a burst. Preferably, the wavelength controls for the laser could be programmed to learn, on an on-going basis, the best degree of pretuning.

Figure 12:
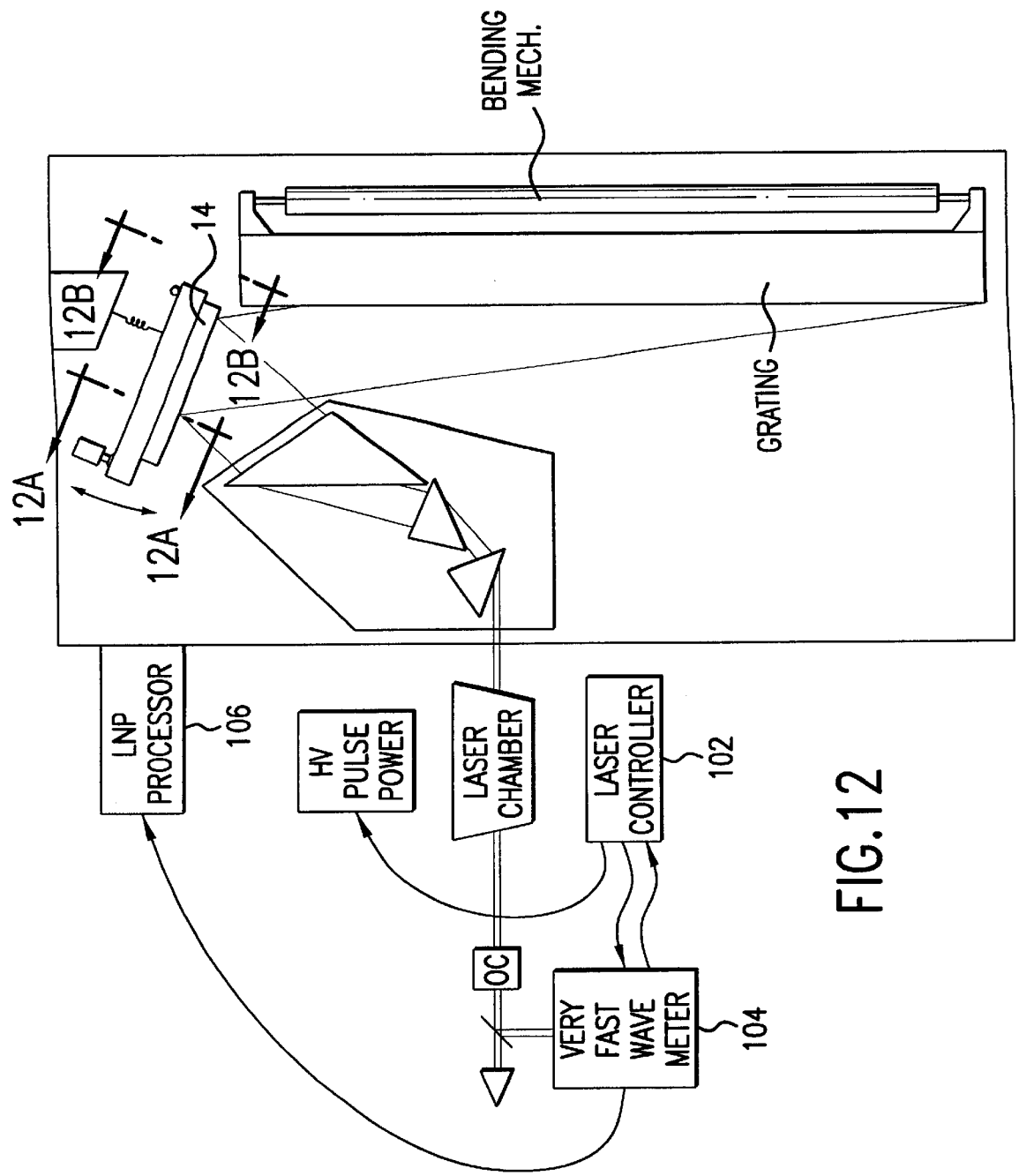
FIGS. 12, 12A and 12B show a proposed technique for providing faster and finer wavelength control.
Figure 12A:
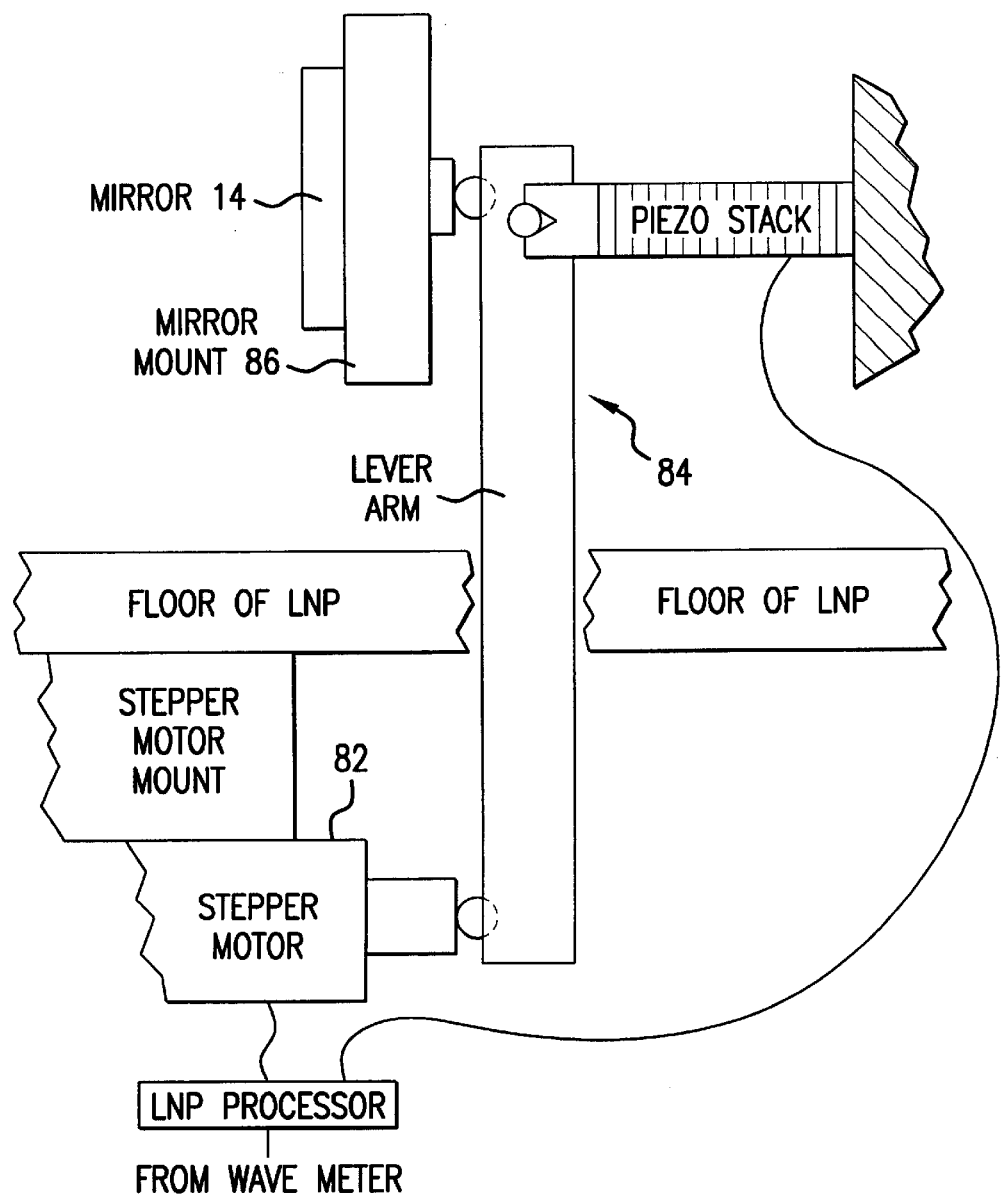
Figure 12B:
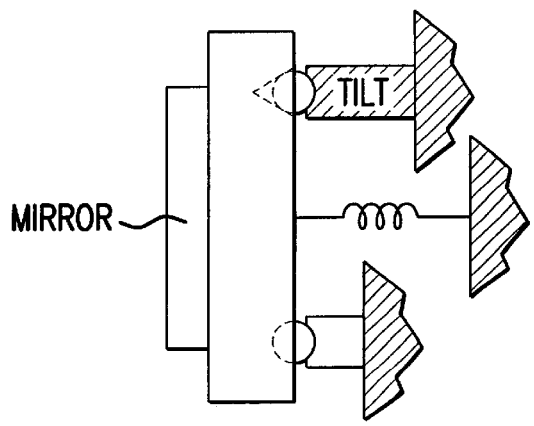

The smallest incremental movement available with prior art stepper motor 15 produces a centerline wavelength change of about 0.05 pm. For this particular laser an incremental change of 0.05 pm for the first 7 ms would increase the wavelength transient values to about zero on the average. Typical prior art tuning mirrors operate with a latency of about 5 to 7 milliseconds so that the laser controls could be programmed to order the mirror to return to its steady state position (the position for producing the desired centerline wavelength after about 30 ms into the pulse) about 5 to 7 milliseconds in advance. For best results mechanical and electrical improvements should be made to the prior art wavelength controls. For faster finer control a piezoelectric driver system could be added to the mirror drive which would provide the needed increase in speed and precession. A preferred design of tuning mirror drive system incorporating the prior art stepper motor arrangement with a piezoelectric assist for fast fine tuning is shown in FIGS. 12, 12A and 12B. With this arrangement, large slower changes in wavelength are provided with the stepper motor and small fast changes are provided with the piezostack.

$Al_2O_3$ Fibers in Wire Mesh Holder

Figure 10A:
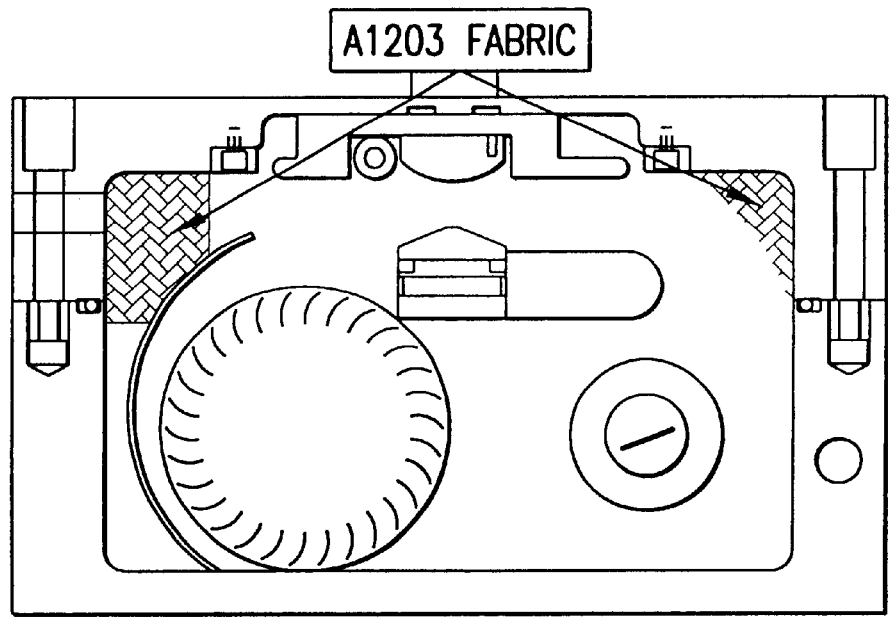
FIGS. 10A and 10B demonstrate the effects of a pressure wave absorber on beam quality.
Figure 10B:
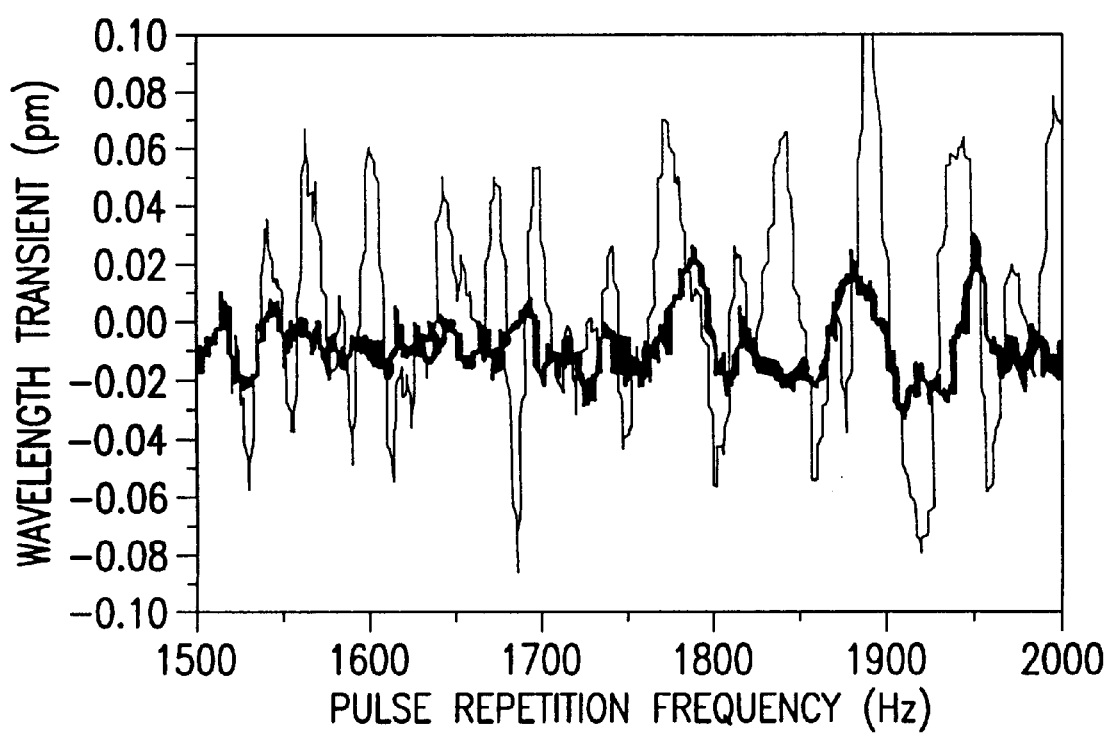

A preferred embodiment of the present invention utilizes pressure wave absorbers consisting of unwoven loosely packed aluminum oxide ($Al_2O_3$) fibers contained in wire mesh holders forming containers having the cross sectional shapes shown at 50 and 52 in FIG. 10A. These holders run the length of the chamber. The fibers are Part Number Al 633790 supplied by Goodfellow Corporation with offices in Berwyn, Pa. Approximately 60 gm of the material was placed as shown in FIG. 10A. The wire mesh is aluminum wire mesh formed of 1 mm diameter wire with a 1 cm grid. The material was tested by operating a KrF laser through pulse frequency range of 1500 Hz to 2000 Hz and comparing the results to similar data using the same chamber with corner reflections of the type shown in FIG. 1. The anode support bar was modified as compared to the FIG. 1 anode support bar mainly to improve gas flow. The results are compared in FIG. 10B. The transient data is shown by the thick line compared to the prior art data shown by the thin line. The $Al_2O_3$ fibers greatly reduce the wavelength transient effect.

Another absorbing non-woven fabric material which could be used is comprised of zirconia and 8 percent yttrium. Since these materials provide very large surface area attack by fluorine is a patented problem so that it is important that the fibers have resistance to fluorine attack. Another possibility is to collect the fibers inside a very thin bag that will transmit the pressure wave but keep the fluorine away from the fibers.

Mitigation with Temperature in Mind

The important new discovery of this invention is the effect of temperature changes in changing the positions of pressure waves bouncing around the chamber. For example, if the gas temperature conditions could be held constant the pressure waves would not be a serious problem. Even if a returning wave for every pulse were centered directly over or partially over the discharge region, all it would do is affect the index of refraction of the gas in the discharge region. This would produce a slight angling of the beam heading to the LNP and unless corrected this angling of the beam would affect the output wavelength. However, a constant angling of the beam would be automatically corrected for by the normal feedback controls on the laser which would merely adjust the position of tuning mirror 14 to produce the desired wavelength. Thus, it is the rapidly changing laser gas temperature that rapidly changes the positions of the pressure waves that causes the problem.

Methods for Keeping Temperature Constant

The problem of wavelength chirp can be corrected by keeping the gas temperature constant. This can easily be done by operating the laser continuously. At continuous operation, chirp goes away. The problem with this approach is that integrated circuit fabricators do no want to operate their lasers continuously. Continuous operation would substantially increase operating costs. Continuous operation is not a desirable solution to wavelength chirp, but it is a solution which generally significantly improves beam quality.

Continuous Operation

Since the downtime between bursts is about equal to the length of the burst, it might be economical to use one laser operating continuously as the light source for two stepper or scanner machines. This would require a fast optical switch for switching the laser output beam between the two lithography machines and would greatly complicate operation but in some very automated situation such an arrangement might be cost effective. One technique for fast switching of laser beams is described in U.S. Pat. No. 5,852,621. An advantage of this arrangement (to be weighed against the many serious disadvantages) is that beam quality could be optimized based on the continuous operation of the laser.

An alternative to continuous operation is to provide a heat source near the electrodes to add heat to the gas when the laser is not firing. This would need to be a very fast heat source since the temperature cycles are in the millisecond range. One approach would be to install electrodes 90 just downstream of the existing electrodes as shown in FIG. 12 that would provide only heat and no lasing. Other very fast acting heaters available on the market could be used to minimize the temperature transients.

Another approach is to provide a passive heat sink with very large surface area preferably just downstream of the electrodes. This heat sink would absorb heat from the gas when the laser is lasing and would add heat to the gas during down times. This would have the affect of substantially reducing the temperature swings during burst mode operation and thus reduce the changes in the distance the reflecting pressure waves travel. The non-woven fibers referred to above placed in the chamber mainly to absorb the pressure waves provide the added benefit of moderating the temperature swings. The mass of the fibers is about 60 gm compared with about 50 gm of laser gas and the specific heat of $Al_2O_3$ is greater than the specific heat of the laser gas. Heat is transferred very rapidly between the fibers and the gas when there is a temperature difference, so the fibers tend to moderate the temperature swings (such as those shown in FIG. 2G) inside the laser chamber.

Spatially Varying Temperatures

Another method of dispersing the pressure waves to improve variations in the gas temperature in the direction of the long dimension of the discharge region. One easy way to do this is to use a one pass water cooled heat exchanger with a water flow rate low enough to produce a substantial gradient across the length of the chamber. For example, a water flow rate of about 6 l/m will produce a $\Delta T$ of about 40° C. This 40° C. gradient will be substantially picked up by the laser gas the result in that the earliest reflections at one end of the chamber arrive back at the discharge region about 1.5 cm ahead of the earliest reflections at the other end. Another approach is to vary the size of the heat exchange fins along the length of the heat exchange so as to create several regions of different temperature along the length of the chamber to help fractionalize the pressure waves returning to the discharge region. A preferred design is shown in FIG.

20. The heat exchanger should be designed to produce temperature variations from region to region of at least 10° C. As indicated above, at 2000 Hz a reflecting wave will be delayed at least about 0.8 mm for each 2° C. temperature decrease so reflections from the hotter regions will mostly (at least) pass through the discharge region before a sibling wave from a 10° C. colder region arrives at the discharge region. Another approach is to provide the same size fins along the length of the heat exchange but insulate sections of the fins from the cooling water tube so that these fins act as passive heat sinks tending to hold a region of the flow at time averaged temperatures.

Active Wavelength Control—Predrive Using Slow Wavelength Controls

Figure 14:
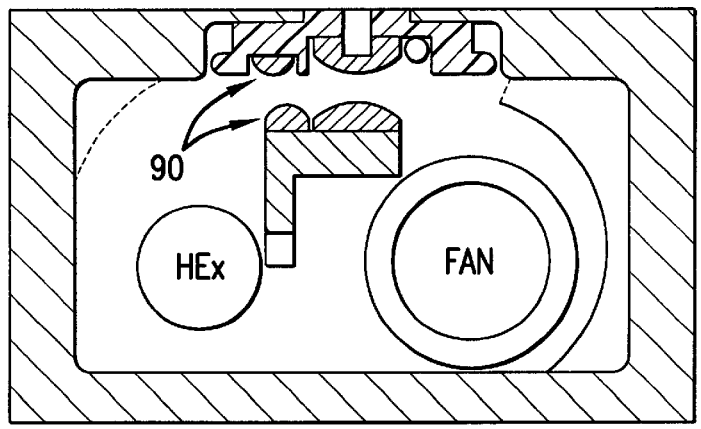
FIG. 14 shows a second set of electrodes downstream of the first set.
Figure 20:
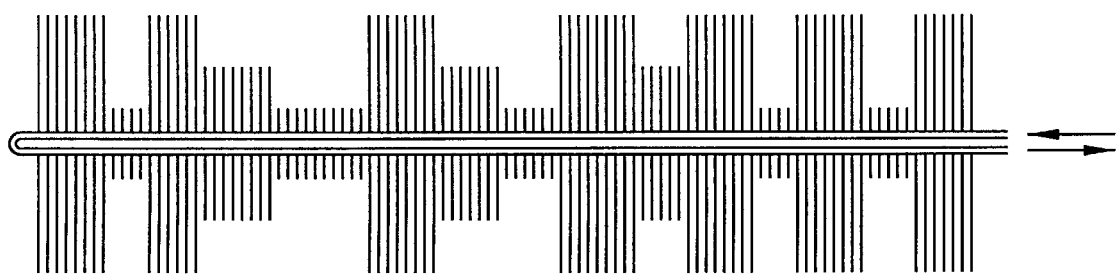
Figure 15A:
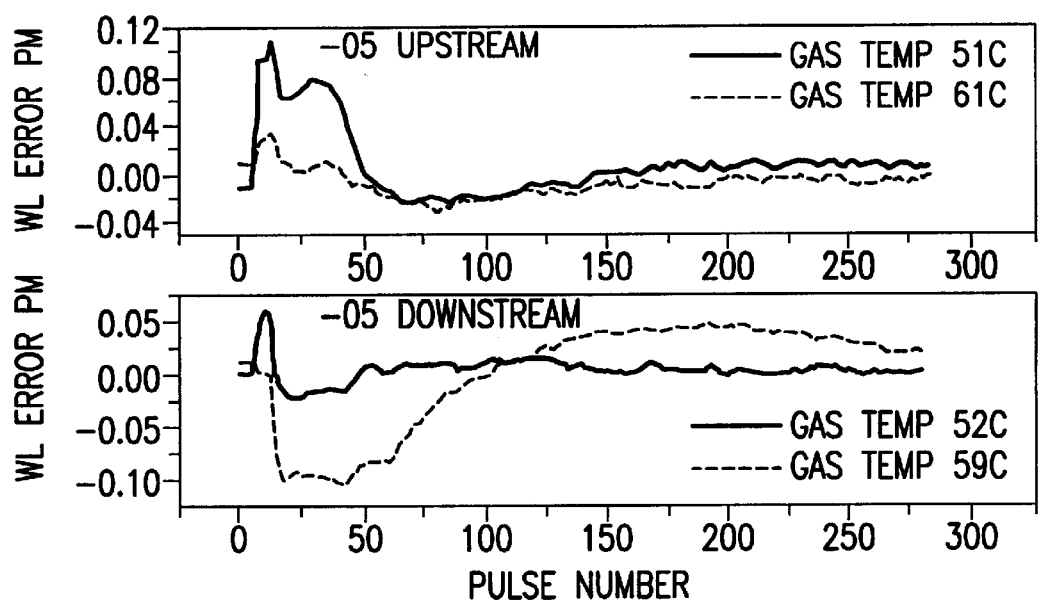
FIGS. 15A and B show effects of temperature changes.

A first preferred embodiment of the present invention utilizes prior art wavelength control technology to provide active correction of a relatively slow and definable chirp. As shown in FIG. 11C4 and described in the accompanying text, the saw-tooth baffles eliminated the major portion of the chirps shown in FIG. 11C1. However, as shown in FIG. 11C4 the wavelengths of the pulses in the early first 15 ms portion of the burst were on the average 0.026 pm below the steady-state wavelength for the bursts. Some actual typical patterns for the bursts are as shown in FIG. 15A. FIG. 15A shows chirps produced by two different chamber configurations each at two different nominal laser gas temperature. The top two charts were from a chamber having the preionizer 46 located upstream of the electrodes as shown in FIG. 14 and the bottom two charts were from a chamber having the preionizer located downstream as shown in FIG. 1. These patterns are very consistent for a particular laser chamber at a specific nominal gas temperature and repetition rate. Lithography laser chambers operating in burst mode as a general rule produce a relatively slowly developing pattern of the types shown in FIG. 15A.

Figure 15B:
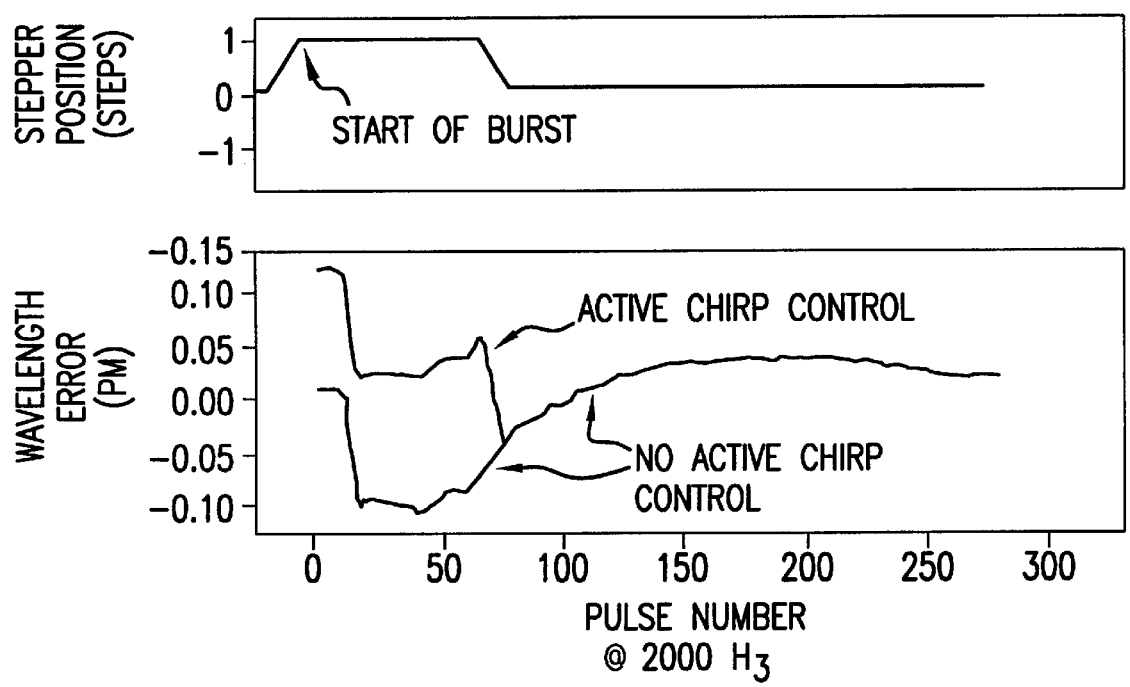
FIG. 15C is a flow chart wavelength control.

These relatively slowly developing patterns can be partially corrected using the relatively slow wavelength controls of prior art lithography lasers. For the type of controls shown in FIG. 3, this is done by adjusting mirror 14 in anticipation of a slowly developing chirp. For example, by programming a one step movement of stepper motor 15 substantially in advance of a pulse and programming a start of a return to the steady state stepper position 30 milliseconds (60 pulses) after the start of the burst, the wavelength data shown in the 59° C. curve of FIG. 15A would be adjusted to that shown in FIG. 15B. The stepper motor position adjusting the mirror 14 position is also shown. With the prior art system shown in FIG. 3, from the signal to move, about 2 millisecond past before the mirror begins moving and it takes about 5 milliseconds for the mirror to pivot an amount equivalent to one stepper motor step which produces a 0.10 pm change in the wavelength. The reader should note that with the active chirp control all pulses (except the 2 or 3 pulse) are within 0.05 pm of the target wavelength. This is a substantial improvement from the original data when more than 50 pulses deviated from target by more than 0.05 pm. The fact that the first 2 or 3 pulses have excessively longer wavelengths is not a serious problem especially for lithography scanners since only a small portion of these pulses are utilized in the die region of the wafer. Thus, with this preferred embodiment, the laser operator must become familiar with the wavelength pattern of each particular lithography laser and program the laser controls to anticipate the slow chirp at the beginning of the burst.

To assist the operator, Applicants provide software which allows the operator to insert two parameters (called "configurables") into the laser controls. These two configurables are the number of steps of initial offset and the duration of the offset (in milliseconds) not less than 7 milliseconds. So, for example, for the FIG. 15B situation the configurables would be "1" and "30".

The technique described above is a type of "pre-drive" in which the operator tells the laser to make certain specific wavelength adjustments at certain times prior to and/or during a burst. The purpose, as in the above example could be to maintain wavelength within a narrow desired wavelength range or it could be to produce a desired change of wavelength during the burst.

Smaller Steps

The smallest full steps of the prior art stepper motor (Model 18503 provided by Oriel Instruments with offices in Stratford, Connecticut) is about 2 microns which is demagnified (25 to 1) to produce a mirror movement of about 75 nm and a wavelength change of about 0.1 pm. The motor can be moved on half step increments to produce a 0.05 pm change. The same stepper motor supplier has available a stepper motor with twice the range. It is Model 18512. Improved control can thus be provided by using Model 18512 and providing a 50 to 1 demagnification. Thus with this simple change the step increment is reduced to 0.05 pm and the half step is reduced to 0.025 pm. This permits a substantial improvement in wavelength control at these fine resolutions.

SECOND PREFERRED EMBODIMENT

Learning Algorithm with Slow Controls

Figure 15C:
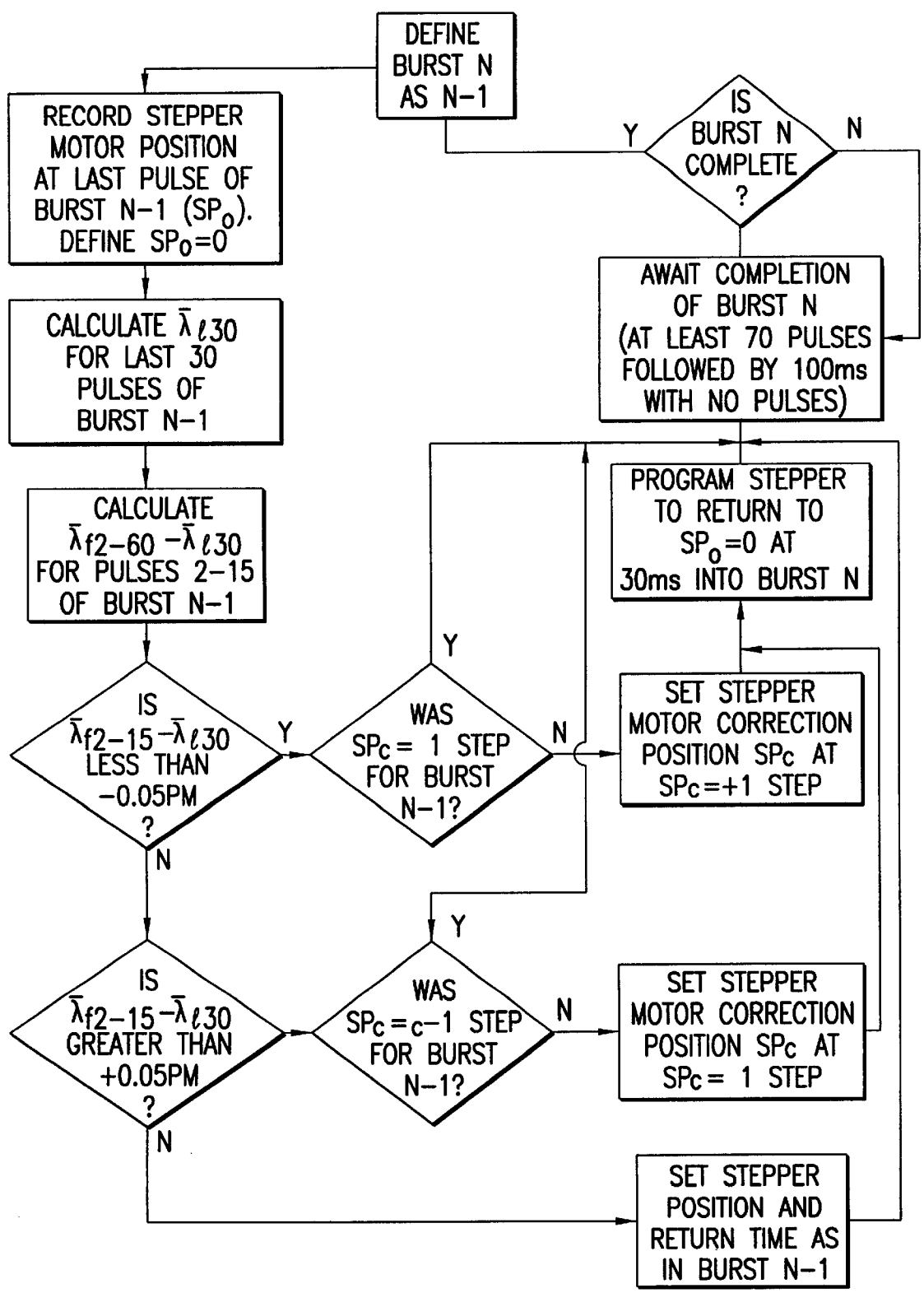

In a second preferred embodiment the laser controls are programmed to detect patterns of the type shown in FIG. 15A and calculate the proper values for initial offset and duration of the offset. A simple learning program is shown in block form in FIG. 15C for correcting a chirp in burst N based on data from the previous burst, N–1. As shown in FIG. 15C a zero value stepper position, $SP_c$, is recorded representing the stepper position of the N–1 burst at equilibrium (i.e., at the end of the burst). The average wavelength of the last 30 pulses and the average wavelength for pulse 2–60 for burst N–1 are determined. A difference is calculated and this difference is used to preset the stepper motor position ($SP_c$) either one step in or out which in each case produces a 0.1 pm correction. In this simple learning algorithm the step is made substantially advance of the start of the burst and the signal for the stepper motor to return to zero is programmed to be given 30 ms after the start of the burst so that the mirror position is back to its steady state (zero) position about 7 ms into the burst. According to the algorithm if the absolute value of $\bar{\lambda}_{/2-60}-\bar{\lambda}_{130}$ is less than 0.05 pm for burst N–1, the step adjustment for burst N is the same as for burst N–1. If the chirp in burst N–1 is negative as the result of positive correction step in burst N–1 or if the chirp in burst N–1 is positive as the result of a negative correction step in burst N–1, no correction step is made in burst N.

With the smaller step stepper, the algorithm outlined in FIG. 15C should be modified to reduce the 0.1 pm dead band suggested by FIG. 15C. With a 0.05 pm step the ±0.05 of FIG. 15C preferably is changed to ±0.025. Alternatively, if half steps can be used the dead band could be reduced to 0.0125 pm.

Fast Wave Meter

In order to provide rapid control of wavelength such as at time intervals shorter than the time between pulses (0.5 ms for a 2000 Hz laser) it is desirable to be able to measure the wavelength faster than the time between pulses. Typical prior art lithography lasers require almost 2 ms to measure the wavelength. A description of a wavemeter and a technique for measuring wavelength is provided in U.S. Pat. No. 5,991,324 which is incorporated herein by reference. The following is a description of a similar wavemeter which has been modified to record the necessary data and perform the necessary calculation to determine wavelength at speeds of less than 420 microseconds.

Figure 16:
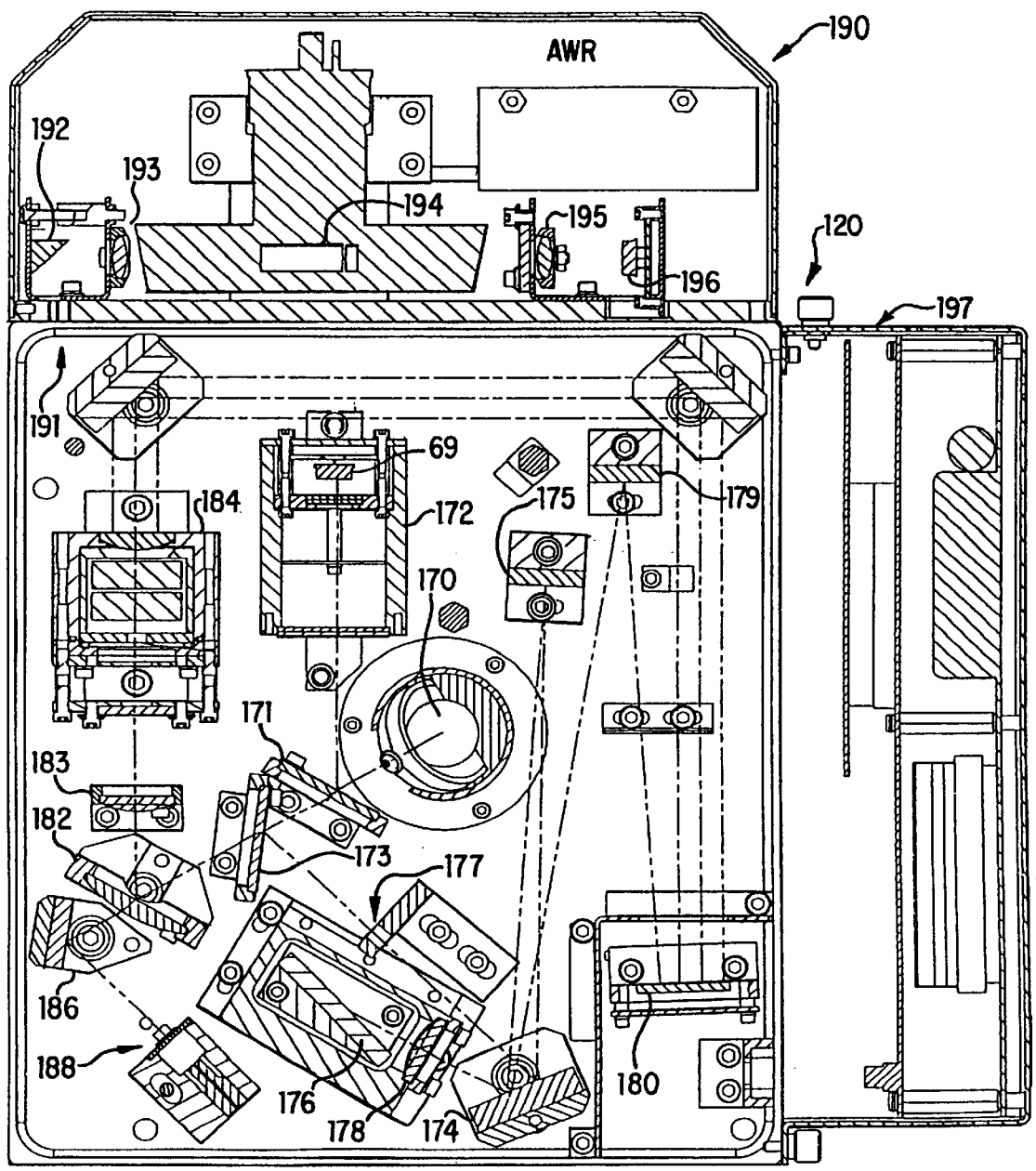
FIG. 16 is a layout of a wavemeter.

As shown in FIG. 16, the output beam from the laser chamber intersects partially reflecting mirror 170, which passes about 95.5% of the beam energy and reflects about 4.5% into wavemeter 120.

About 4% of the reflected beam is reflected by mirror 171 to energy detector 172 which comprises a very fast photo cell 92 which is able to measure the energy of individual pulses occurring at the repetition rate of 4,000 pulses per second or greater. A typical pulse energy is about 10 mJ and the output of detector 69 is fed to computer controller 102 (FIG. 12) which uses a special algorithm (described in U.S. Pat. No. 6,005,879, incorporated herein by reference) to adjust the laser charging voltage to precisely control the pulse energy of future pulses based on stored pulse energy data in order to limit the variation of the energy of individual pulses and the integrated energy of bursts of pulses, all as described hereinafter. About 4% of the beam which passes through mirror 171 is reflected by mirror 173 through slit 177 to mirror 174, to mirror 175, back to mirror 174 and onto eschelle grating 176. The beam is collimated by lens 178 having a focal length of 458.4 mm. Light reflected from grating 176 passes back through lens 178, is reflected again from mirror 174. And then is reflected from mirror 179 and focused onto the left side of linear photo diode array 180. The position of the beam on the photo diode array is a coarse measure of the relative nominal wavelength of the output beam. About 90% of the beam which passes through mirror 173 is reflected off mirror 182 through lens 183 into etalon 184. The beam exiting etalon 184 is focused by a 458.4 mm focal length lens in the etalon and produces interference fringes on the middle and right side of linear photo diode array 180 after being reflected off two mirrors as shown in FIG. 10.

Linear Photo Diode Array

Linear Photo diode array 180 is an integrated circuit chip comprising 1024 separate photo diode integrated circuits and an associated sample and hold readout circuit. The photo diodes are on a 25 micrometer pitch for a total length of 25.6 mm (about one inch). Each photo diode is 500 micrometer long. Photo diode arrays such as this are available from several sources. A preferred supplier is Hamamatsu. In one preferred embodiment, we use a Model S3903-1024 which can be read at the rate of $2.5 \times 10^6$ pixels/sec on a FIFO basis in which complete 1024 pixel scans can be read at rates greater than 2000 Hz. A faster array is Model RL 2048 PAQ supplied by EG&G Reticon with offices in Sunnyvale, Calif. This PDA can be read at 2,048 pixels at a 16.875 kilohertz frame rate.

Calculation of Coarse Wavelength

The coarse wavelength optics in wavemeter module 120 produces a rectangular image of about 0.25 mm×3 mm on the left side of photo diode array 180. The ten or eleven illuminated photo diodes will generate signals in proportion to the intensity of the illumination received and the signals are read and digitized by a processor in wavemeter controller 197. Using this information and an interpolation algorithm controller 197 calculates the center position of the image.

This position (measured in pixels) is converted into a coarse wavelength value using two calibration coefficients and assuming a linear relationship between position and wavelength. These calibration coefficients are determined by reference to an atomic wavelength reference source as described below. For example, the relationship between image position and wavelength might be the following algorithm:

$$\lambda = (2.3 \text{ pm/pixel})P + 248,350 \text{ pm}$$

where P=coarse image central positions

Fast Calculation of Fine Wavelength

The spectrometer must measure wavelength and bandwidth substantially in real time. Because the laser repetition rate may be 2 kH$_Z$ or higher, it is necessary to use algorithms which are accurate but not computationally intensive in order to achieve the desired performance with economical and compact processing electronics. Preferably, Applicants use integer as opposed to floating point math, and operations are all linear (or use of square root, sine, log, etc.).

Figure 16A:
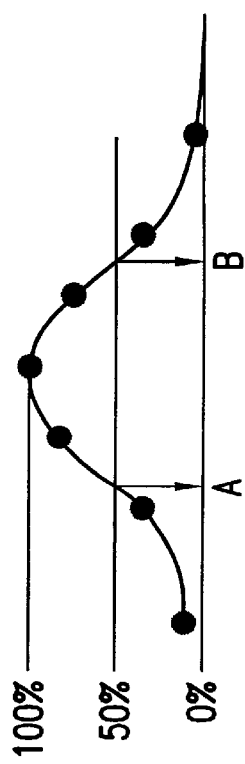
FIGS. 16A and 16B show photodiode array data plots.
Figure 16B:
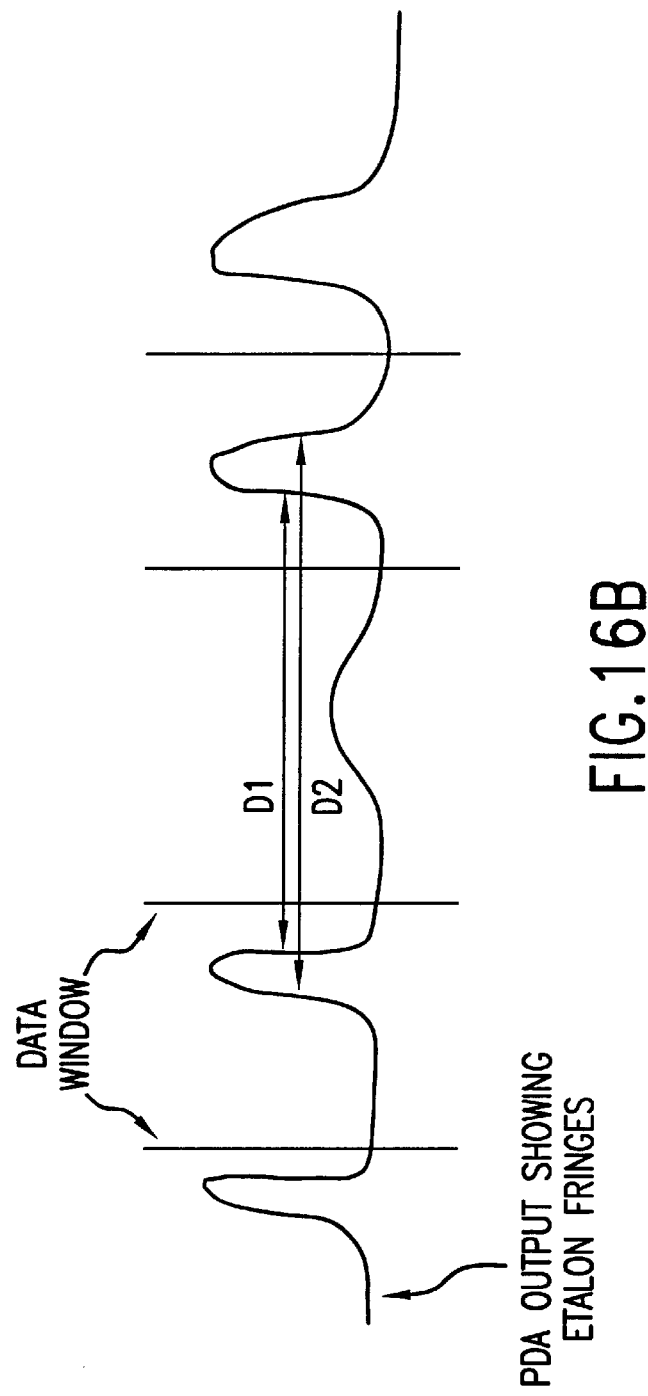

The specific details of a preferred algorithm used in this preferred embodiment will now be described. FIG. 16B is a curve with 5 peaks as shown which represents a typical etalon fringe signal as measured by linear photo diode array 180. The central peak is drawn lower in height than the others. As different wavelengths of light enter the etalon, the central peak will rise and fall, sometimes going to zero. This aspect renders the central peak unsuitable for the wavelength measurements. The other peaks will move toward or away from the central peak in response to changes in wavelength, so the position of these peaks determines the wavelength, while their width measures the bandwidth of the laser. A region labeled "data window" is shown in FIG. 16B. The data window is located so that the fringe nearest the central peak is normally used for the analysis. However, when the wavelength changes to move the fringe too close to the central peak (which will cause distortion and resulting errors), the second closest peak will be inside the data window, and the software will jump to that peak. Conversely, when the wavelength shifts to move the current peak outside the data window away from the central peak the software will jump to an inner fringe within the data window.

The steps involved are as follows:

1. After a laser pulse, the photo diode array output is electronically read out and digitized. Data points are separated by an interval physically determined by the spacing of the photo diode array elements, in this case 25 micrometer pitch.
2. The digital data is searched to find the peak intensity value in the data window. The previous peak location is used as a starting point. Small regions are searched left and right of the starting point. The search region is extended by small intervals left and right until a peak is found. If the peak is outside the data window, the search will automatically continue until the other peak is found.
3. Based on the intensity of the peak, a 50% level is computed as shown in FIG. 16A. The 0% level is measured periodically between the pulses. Based on the computed 50% level, points are examined right and left of the peak until the data points which border the 50% level are found. A linear interpolation is computed between pairs of points, which border the 50% level to find the left and right half-maximum positions, labeled A, and B in FIG. 16A. These positions are computed to a fraction of a pixel such as $\frac{1}{16}$, using an integer data format.

4. Steps 2 and 3 are duplicated for the two data windows, giving a total of four interpolated 50% positions. As indicated FIG. 16B, two diameters are computed. D1 is the inner fringe diameter while D2 is the outer fringe diameter.

5. An approximation to the wavelength is determined by the coarse wavelength circuit, as described in the preceding section "Calculation of Coarse Wavelength."

Fine Wavelength Calculation

The inner and outer fringe diameters D1 and D2 (in units of pixels) are each converted to wavelength by the following equations:

$$\lambda = \lambda_0 + Cd(D^2 - D_0^2) + N \cdot FSR$$

where $\lambda$=wavelength corresponding to diameter D
$\lambda_0$=calibration wavelength
$D_0$=diameter corresponding to wavelength $\lambda_0$
Cd=calibration constant dependant on the optical design
FSR=free spectral range of the etalon
N=integer, =0, ±1, ±2, ±3 . . .

The values $\lambda_0$, $K_1$, FSR, and $D_0$ are determined and stored at the time of calibration. The value for N is chosen such that:

$$|\lambda - \lambda_c| \leq \frac{1}{2} FSR$$

where $\lambda_c$=coarse wavelength determination.

For example, in a preferred embodiment, we select a reference wavelength $\lambda_0$=248,327.1 pm (corresponding to an absorption line of an iron hollow cathode lamp). At this wavelength, the fringe diameter $D_0$ might be found to be 300 pixels. Cd is a constant which can either be directly measured or calculated from the optical design. In our preferred embodiment, Cd=-9.25×10$^{-5}$ pm/pixel$^2$. Thus, for example, with the laser operating at a different wavelength, the fringe diameter may be measured to be 405 pixels. The possible wavelengths computed by equation (1) are:

$$\lambda = 248,327.1 \text{ pm} - 9.25 \times 10^{-5} \text{ pm/pixel}^2[(405)^2 - (300)^2] + N \cdot FSR = 248,333.95 + N \cdot FSR$$

If the free spectral range FSR=20 pm, then the possible values for $\lambda$ include:

| | |
|---|---|
| 248,293.95 pm | N = -2 |
| 248,313.95 pm | N = -1 |
| 248,333.95 pm | N = 0 |
| 248,353.95 pm | N = +1 |
| 248,373.95 pm | N = +2 |

If the coarse wavelength is measured to be $\lambda_c$=248,350, for example, then the processor will select the value $\lambda$=248,353.95 pm (N=+1) as the solution in the closest agreement with $\lambda_c$.

The inner and outer fringe diameters $D_1$ and $D_2$ as shown in FIG. 16B are each converted into wavelengths $\lambda_1$ and $\lambda_2$, respectively. The final value which is reported for the laser wavelength is the average of these two calculations:

$$\lambda = \left(\frac{\lambda_1 + \lambda_2}{2}\right)$$

Bandwidth Calculation

The bandwidth of the laser is computed as $(\lambda_2 - \lambda_1)/2$. A fixed correction factor is applied to account for the intrinsic width of the etalon peak adding to the true laser bandwidth. Mathematically, a deconvolution algorithm is the formalism for removing the etalon intrinsic width from the measured width, but this would be far too computation-intensive, so a fixed correction $\Delta\lambda\epsilon$ is subtracted, which provides sufficient accuracy. Therefore, the bandwidth is:

$$\Delta\lambda = \left(\frac{D_2 - D_1}{2}\right) - \Delta\lambda\epsilon$$

$\Delta\lambda\epsilon$ depends on both the etalon specifications and the true laser bandwidth. It typically lies in the range of 0.1–1 pm for the application described here.

Wavelength Calibration

About 10% of that portion of the beam that passes through mirror 182 are reflected from mirror 186 into fiber optic input 188 and the light travels through an optical fiber to atomic wavelength reference 190. The optical fiber connects to atomic reference unit 190 at opening 191, and the light from the optical fiber reflects off mirror 69 and is focused by lens 193 to a focal point in the center of neon iron vapor cell 194, and is focused again by lens 195 onto photodiode 196. Atomic wavelength reference unit 190 is used to calibrate wavemeter 120. This is done by adjusting the wavelength of the laser while keeping the output energy constant as shown by detector 69 while monitoring the output of photodiode 196. When photodiode 196 shows a substantial reduction in output while photodiode 69 shows nominal output, the wavelength of the output must correspond to the iron vapor absorption line of 248.3271 nm. The position data corresponding to the etalon fringes and the position data corresponding to the image produced by grating 176 on linear photodiode 180 when the output of photodiode 196 is lowest is detected and recorded by wavemeter controller 197 and this data are used by wavemeter controller 197 to calibrate wavemeter 120.

Microprocessor For Wavelength Measurement

Since there are only 500 microseconds between pulses of a 2000 Hz laser, wavelengths must be calculated in significantly less than 500 microseconds in order to have an opportunity to correct an upcoming pulse for the wavelength error of the immediately preceding pulse. As stated above, the photodiode array 180 can be read at the rate of 2×10$^6$ pixels/second. The data is read into a buffer memory so that processing of the data can begin during the readout. The processing of the data required to perform the above calculation is preferable done with a Model 68332 25 MHz microprocessor supplied by Motorola Corporation. Applicants have determined that this inexpensive processor can be over clocked to run at 43 MHz with no deterioration in performance. In one preferred arrangement all data is read out from PDA 180 and the wavelength calculations described above are made in a period of 420 microseconds allowing 80 microseconds to move mirror 14 prior the next burst.

Fast Mirror Adjustment

FIGS. 12, 12A and 12B show an arrangement permitting very fast adjustment of mirror 14. This embodiment is a major speed up as compared to the prior art but not quite fast enough for pulse-to-pulse adjustment. As indicated above, prior art methods of mirror positioning required about 7 ms to move mirror 14, making pulse-to-pulse wavelength correction at 2000 Hz out of the question. In that prior art technique, a lever arm pivoted about a pivot axis to produce a 1 to 25 reduction in the mirror movement compared to the stepper position movement. The prior art stepper has a total travel of ½ inch (12.7 mm) and 6000 steps so that each step is a distance of about 2 microns. With the 1–25 reduction, one step moves the mirror about 75 nm which typically changes the wavelength of the laser wavelength about 0.1 pm. In the fast acting technique shown in FIG. 12A, a piezo stack 80 has been added at the pivot position of the lever arm. A preferred piezo stack is Model P-840.10 supplied by Physik Instrumente GmbH with offices in Waldbronn, Germany.

This stack will produce linear adjustment of about 1.5 microns with a drive voltage change of 10 volts. This range is equivalent to about ±10 steps of the stepper motor.

Figure 12C:
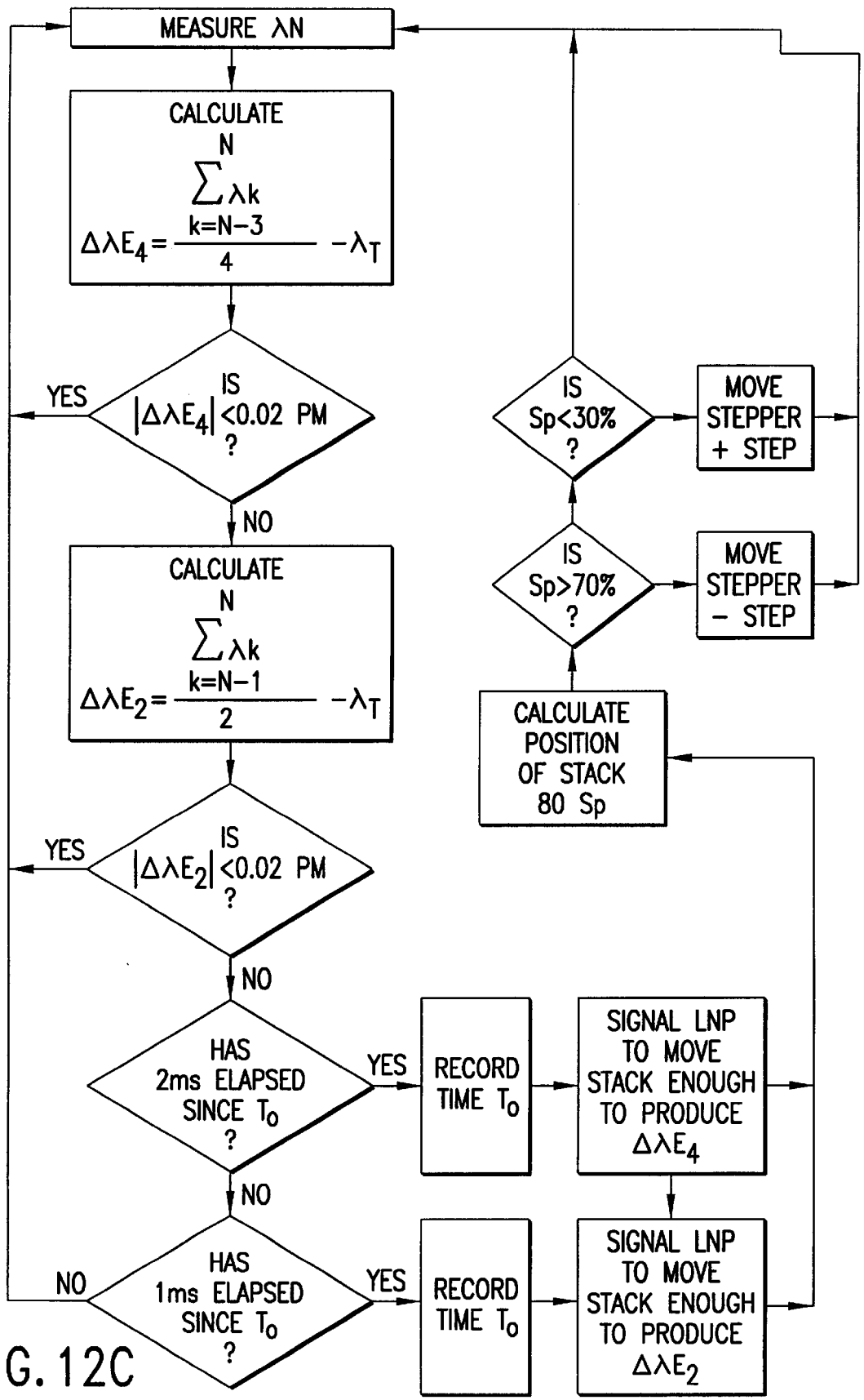
FIGS. 12C and 12D are flow charts describing wavelength control algorithms.

The stack responds to a control signal within less than 1 microsecond but about one millisecond is required to move the relatively heavy mirror 14 and mirror mount 86 assembly. Thus, with this embodiment pulse-to-pulse wavelength correction is not feasible. However, this embodiment provides a factor of 7 improvement over the prior art design with a 7 millisecond latency. Therefore, much faster feedback control can be provided. One preferred feedback control algorithm is described in FIG. 12C. In this algorithm the wavelength is measured for each pulse and an average wavelength for the last four and last two pulses is calculated. If either of the average deviate from the target wavelength by less than 0.02 pm, no adjustment is made. If both deviate more than 0.02 pm from the target, an adjustment is made to the mirror assembly by piezoelectric stack 80 to provide a wavelength correction. Which of the two averages is used is determined by how much time had elapsed since the last adjustment. The piezoelectric stack is maintained within its control range by stepping the stepper motor as the stack approaches 30 and 70 percent of its range. Since the stepper motor requires about 7 ms to complete a step, the algorithm may make several piezo adjustments during a stepper motor step.

Pulse-To-Pulse Feedback Control

Figures 13A, 13B:
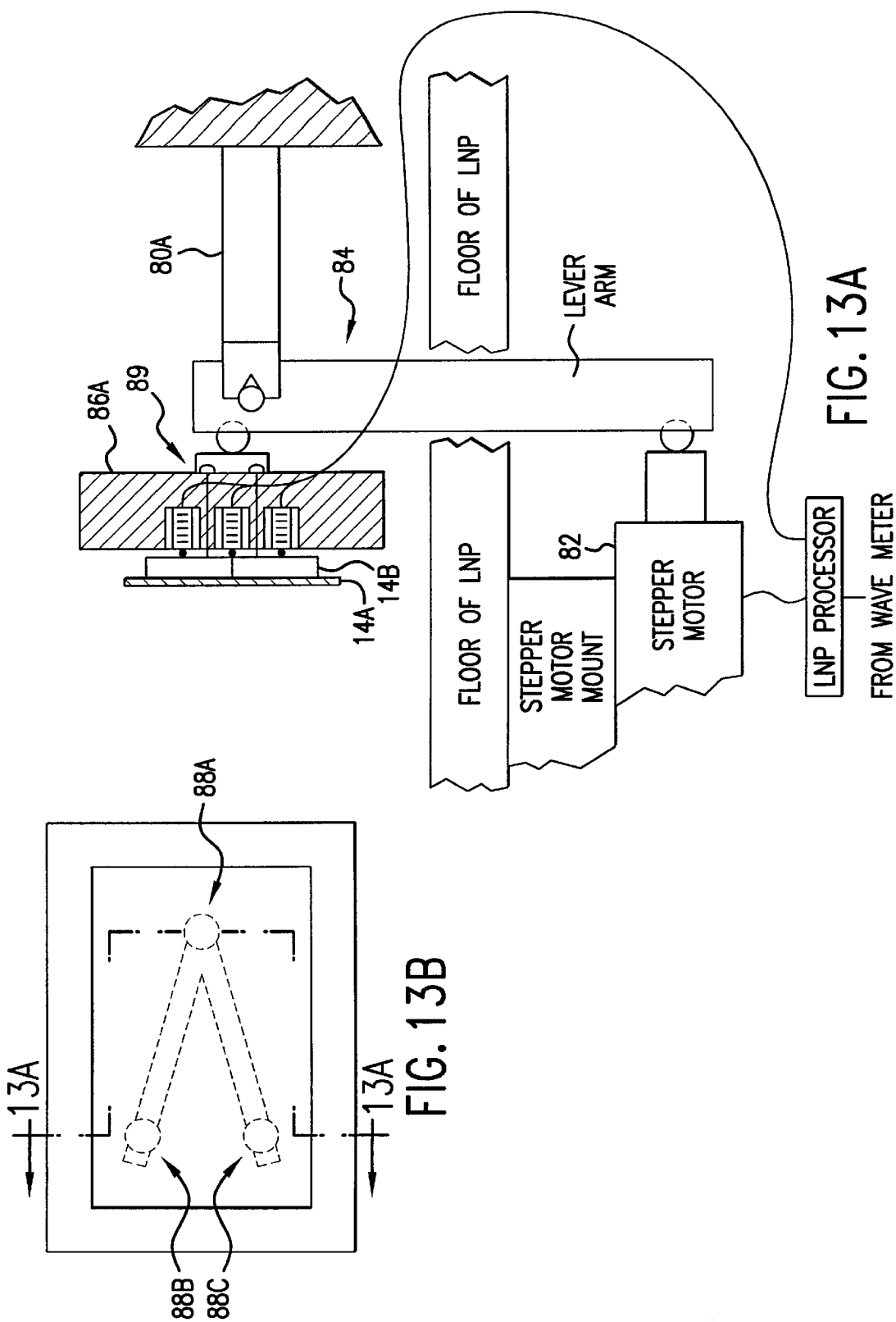
FIGS. 13A and B are drawings of a tuning mirror control.

FIGS. 13A and 13B show a mirror control arrangement which permits adjustment of the mirror more quickly than 80 microseconds so that pulse-to-pulse correction is feasible at pulse repetition rates of 2000 Hz. In this case the piezoelectric stack 80 is replaced by a metal support 80A and instead piezoelectric adjustment is provided for a lightweight mirror 14A with bracing ribs 14B moving relative to the much heavier mirror mount 86A. Mirror 14A is held tightly against spherical contacts at the ends of stacks 88A, 88B and 88C by adjustable tension elements 89.

In this embodiment these piezoelectric stacks provide very fine adjustment of the position of mirror 14A relative to mirror mount 86A. As in the above example, the total adjustment range of the piezoelectric elements 88A, 88B and 88C can be very small such as about 1.5 micron since large adjustments are provided by the stepper motor. Adjustment of this lightweight mirror with the three piezo elements over very small distances such as about 0.1 microns can be extremely fast in the range of about 10 microseconds. The mirror position can be adjusted by moving drive 88A in one direction and drives 88B and 88C in the opposite direction or by moving drive 88A only. As in the prior example, preferred control algorithms outlined in FIG. 12D calls for a stepper motor step if the piezo position reaches as low as about 30 or as high as 70 percent of the control range. This provides a control range without stepper motor movement of 160 nm which is equivalent to about 0.8 pm to about 1.6 pm (depending on whether one or three piezo drivers are used). Therefore, the very fast piezo controls have a range sufficient to control substantially all chirp variations which, as indicated in FIGS. 15A, are typically within the range of ±0.10 pm. Larger wavelength changes are provided by the stepper motor.

Figure 12D:
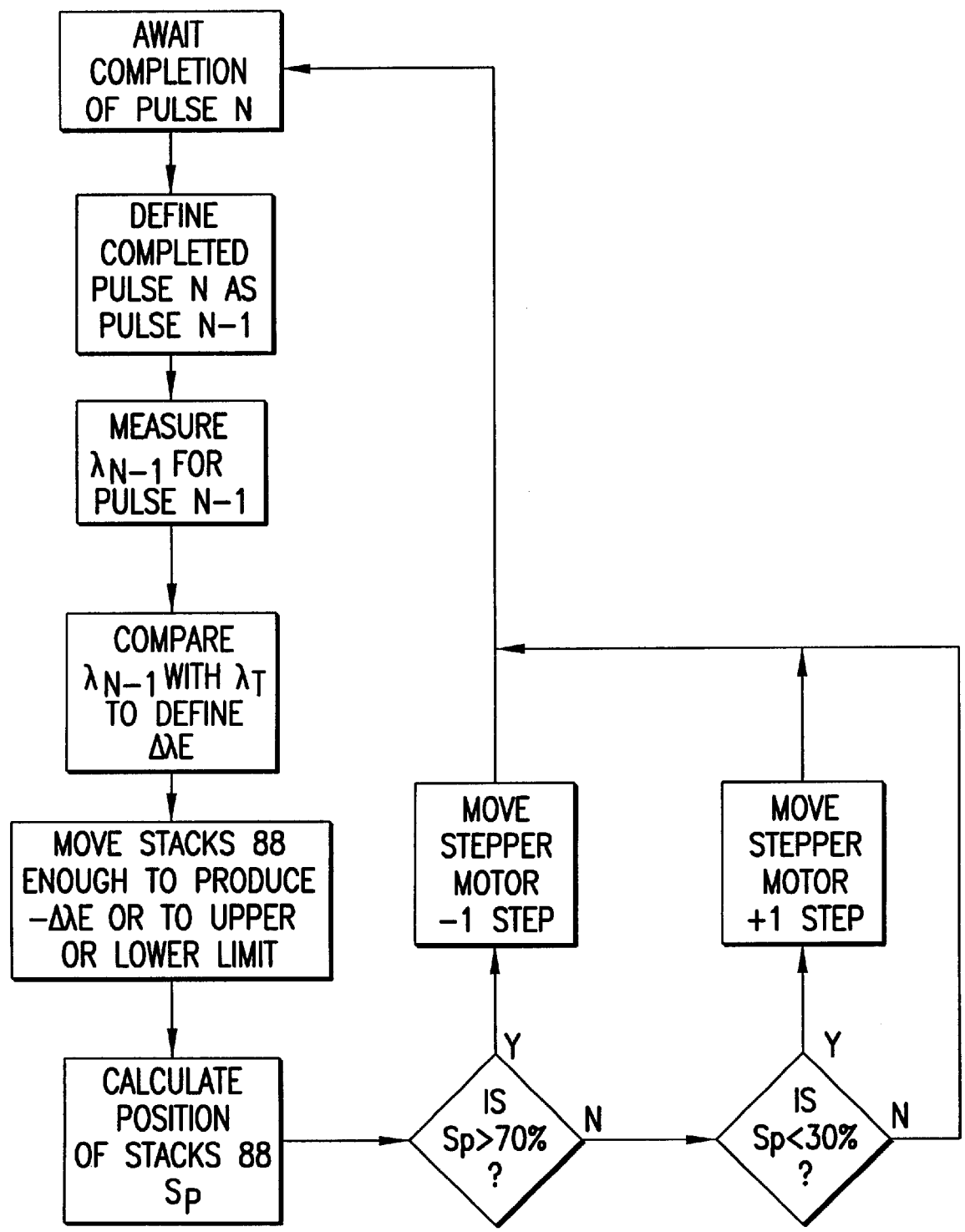

The algorithm outlined in FIG. 12D provides pulse-to-pulse control of the laser wavelength permitting next pulse correction using the very fast mirror design shown in FIGS. 13A, 13B and 13C. The algorithm as described in FIG. 12D awaits completion of a pulse N which it redefines as pulse N–1. It measures the wavelength of the pulse, compares it with a target pulse and moves stacks 88A, 88B and 88C or stack 88A to provide the desired wavelength correction. All of this is done prior to pulse N so that the mirror is moved and is stationary at the time of pulse N. If any of the stacks are outside of its 30% to 70% range, the stepper motor makes a step. The algorithm will then cause the out of range stack to move back within the 30% to 70% range. The position of the stacks are based on their control voltage. The algorithm could be modified so that no piezoelectric adjustment is made if the absolute value of $\Delta \lambda E$ is less than a specified small value such as 0.01 pm which is 20% of one specification value for wavelength variation.

Pretuning and Active Tuning

The embodiments described above can be used for purposes other than chirp corrections. In some cases the operator of a integrated circuit lithography machine may desire to change wavelength on a predetermined basis. In other words the target wavelength $\lambda_T$ may not be a fixed wavelength but could be changed as often as desired either following a predetermined pattern or as the result of a continuously or periodically updating learning algorithm using early historical wavelength data or other parameters.

Mirror Position Determination

Figure 17:
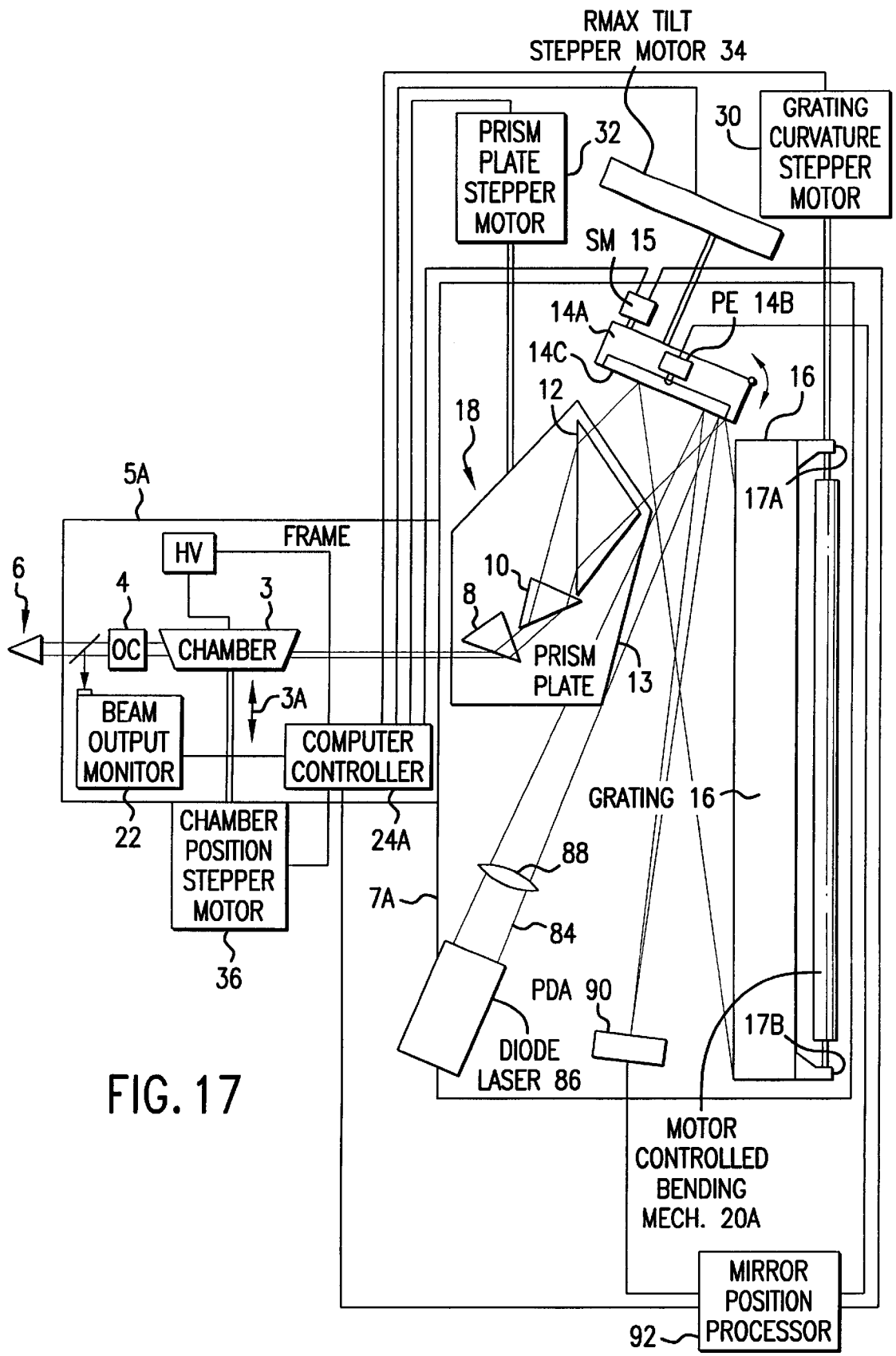
FIGS. 17, 17A and B and FIG. 18 show features of line narrowing modules.
Figure 17A:
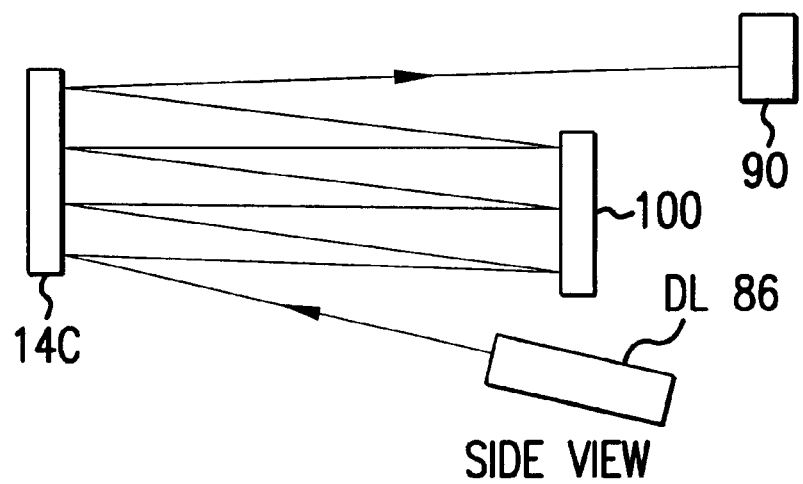
Figure 17B:
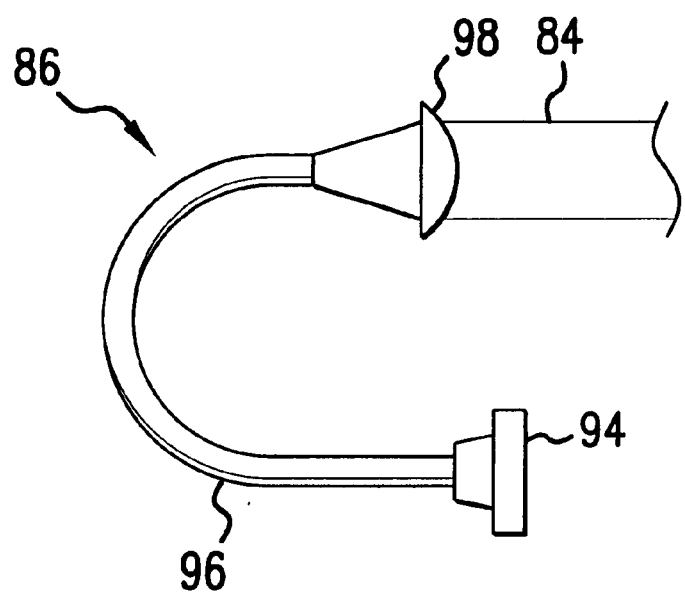

In some cases it may be desirable to control the wavelength by specifying particular mirror positions. This can be done with the embodiments shown in FIGS. 17 and 17A. In this embodiment a diode laser 86 provides a beam which is reflected off mirror 14C and the reflected beam is focused on a photodiode array 90 to determine the pivot position of mirror 14C. This arrangement permits precise positioning of the mirror without having to operate the laser for an actual wavelength measurement. This could be important when accurate prepositioning of the mirror is desired. FIG. 17A illustrates a technique of increasing the optical distance between mirror 14C and the PDA array to improve precision of the pivot measurement.

Deformable Tuning Mirror

Figure 18:
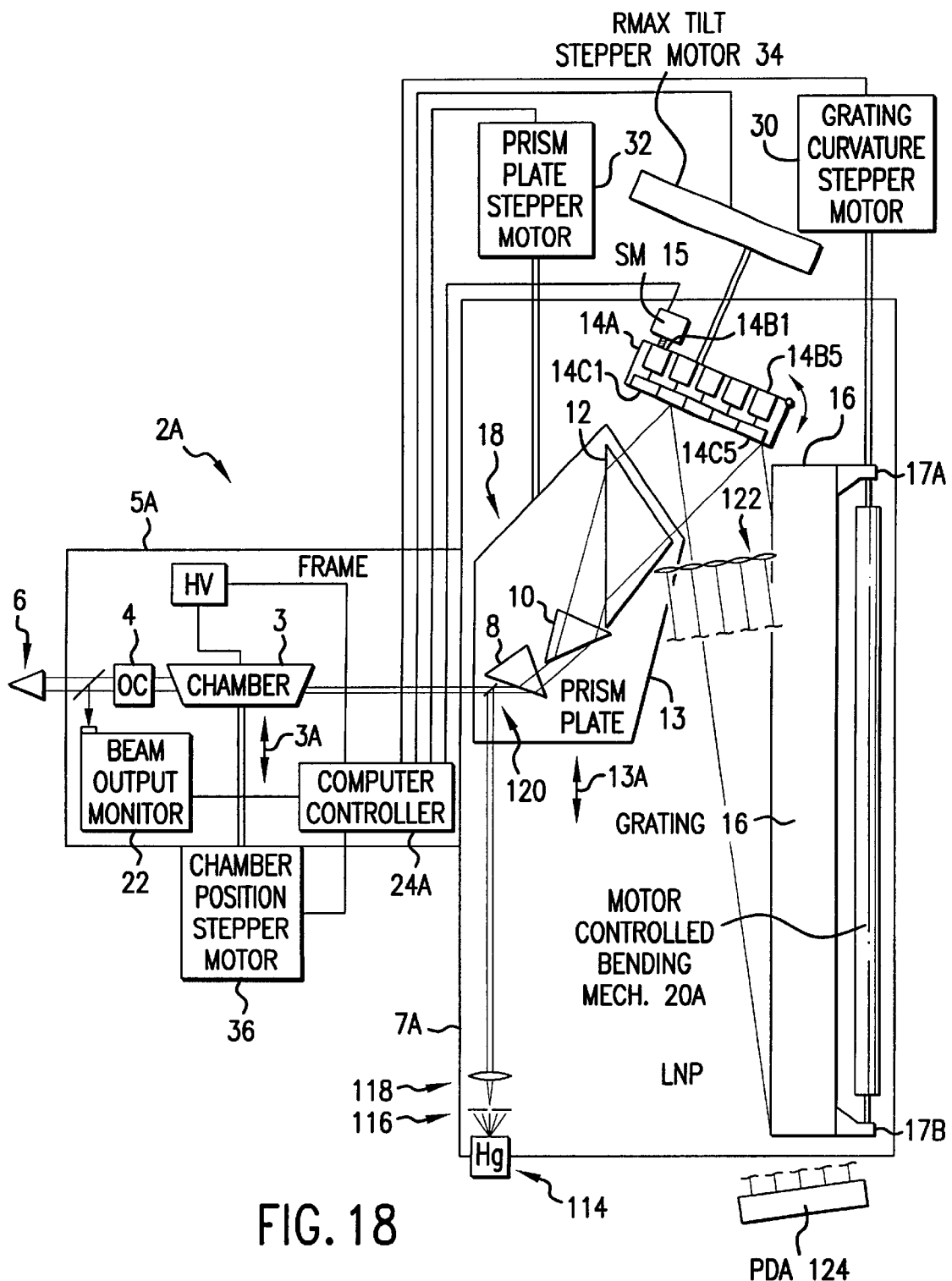

FIG. 18 illustrates the use of a segmented tuning mirror in which each of the 5 mirror segments is controlled by its own piezoelectric drive 141-5. Each of the segments can be operated very fast. This embodiment has an additional advantage of improving the bandwidth of the laser since each horizontal portion of the beam can be individually controlled. This embodiment also has a PDA 124 for determining the position of each segment. The light is provided by a mercury lamp 114 where the UV light is passed through a slit 116 and a columinating lens 118. The beam in this case is expanded through the same beam expander used to expand the laser beam and five small lenses focus light from each mirror on separate parts of the PDA.

Purging Grating Face

Figure 19A:
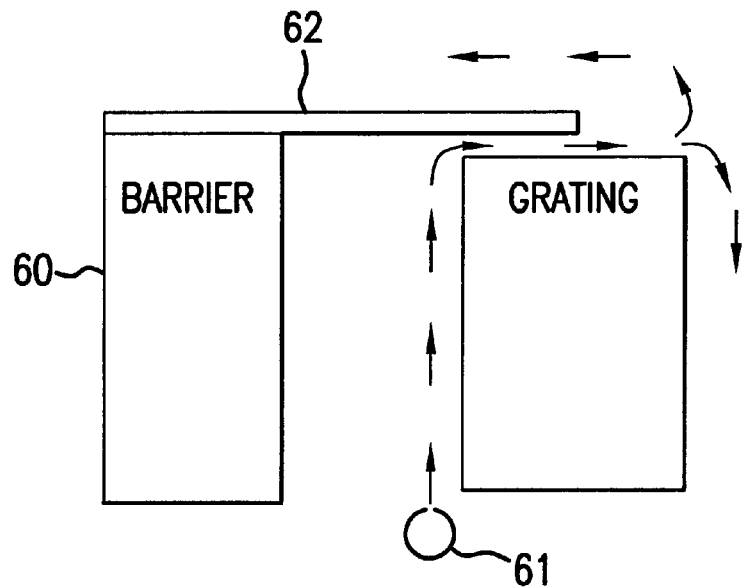
FIGS. 19A, 19B, 19C and 19D show techniques for cooling a grating face.
Figure 19B:
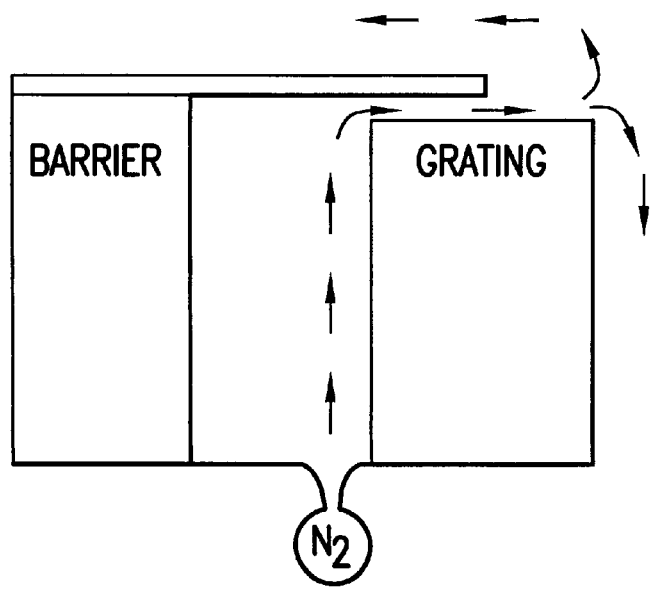
Figure 19C:
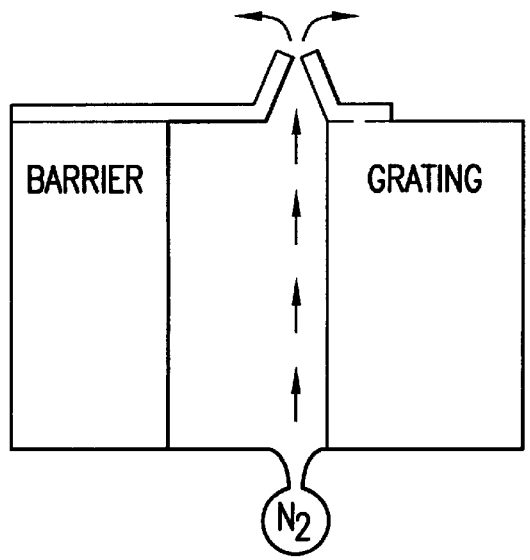
Figure 19D:
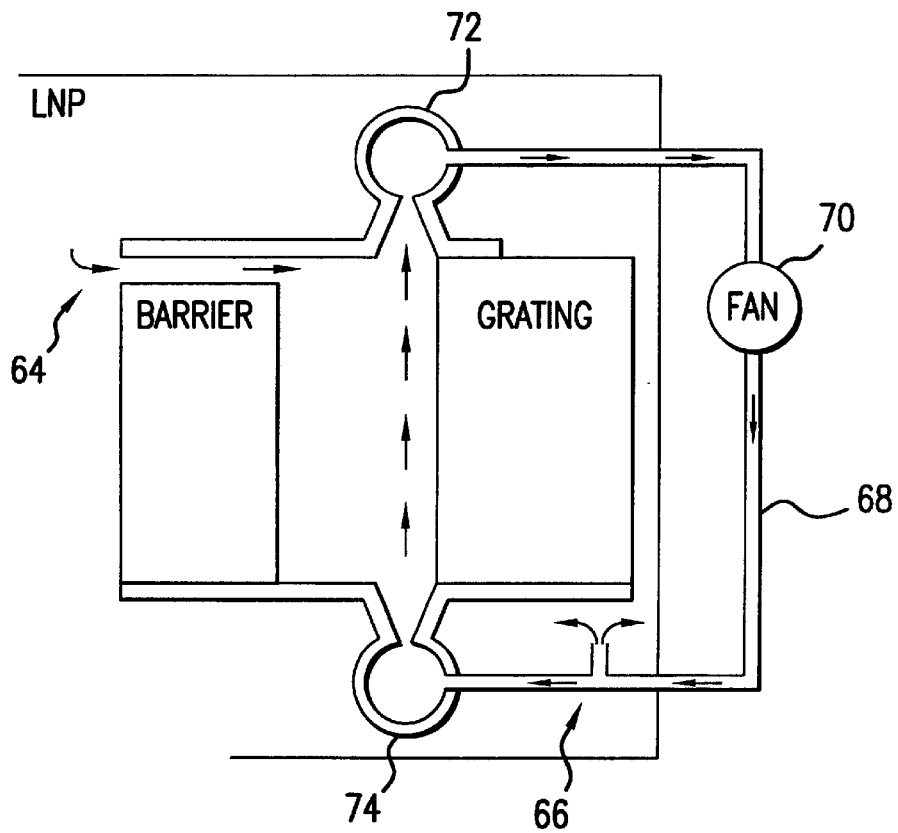

It is known to purge line narrowing packages; however, the prior art teaches keeping the purge flow from flowing directly on the grating face so that purge flow is typically provided through a port located at positions such as behind the face of the grating. Applicants have discovered, however, that at very high repetition rates a layer of hot gas (nitrogen) develops on the face of the grating distorting the wavelength. This distortion can be corrected at least in part by the active wavelength control discussed above. Another approach is to purge the face of the grating as shown in FIGS. 19A, 19B, 19C and 19D. In FIG. 19A, small holes (1 mm or ¼ inch spacings) in the top of 10-inch long ⅜ inch diameter purge tube 61 provides the purge flow. Other techniques are shown in FIGS. 19B, 19C and 19D.

Various modifications may be made to the invention without altering its scope. All of the above are just examples of the present invention. Those skilled in the art will readily recognize that numerous other modifications and alterations may be made without departing from the spirit and scope of the invention. For example, mirror 14 could be adjusted with other fast acting mechanisms such as a piezoelectric drive providing enough tuning range that the stepper motor is not needed. Voice coils could also be used to rapidly position the mirror. Accordingly, the above disclosure is not intended to be limiting and the scope of the invention is to be determined by the appended claims.

We claim:

1. An electric discharge laser with active wavelength chirp mitigation comprising:
   A) a laser chamber,
   B) an elongated electrode structure enclosed within said chamber comprising an elongated anode and an elongated cathode separated by a distance defining a discharge region, said discharge region defining a long dimension in a beam direction,
   C) a laser gas contained in said chamber,
   D) a fan for circulating said laser gas within said chamber and through said discharge region, and
   E) an active chirp mitigation means comprising at least one processor controlled moving part for mitigating wavelength chirp resulting from acoustic effects occurring in said laser chamber.

2. A laser as in claim 1 wherein said active chirp means comprises a tuning mirror and an adjusting means for adjusting the position of the tuning mirror in advance of a burst of pulses to mitigate a chirp occurring in an early part of the burst.

3. A laser as in claim 2 wherein the early occurring chirp has a duration of a few milliseconds.

4. A laser as in claim 2 wherein said adjusting means comprises a stepper motor.

5. A laser as in claim 2 wherein said adjusting means comprises a processor programmed with a learning algorithm for learning the shape of the early occurring chirp.

6. A laser as in claim 1 wherein said active chirp mitigation means comprises a fast control means for providing mirror adjustments in time periods of less than 2 milliseconds.

7. A laser as in claim 1 wherein said active chirp mitigation means comprises a fast control means for providing mirror adjustments in time periods of less than 500 microseconds.

8. A laser as in claim 1 wherein said active chirp mitigation means comprises a piezoelectric device.

9. A laser as in claim 8 wherein said active chirp mitigation means also comprises a stepper motor having an external spindle.

10. A laser as in claim 9 wherein said active chirp mitigation means also comprises a lever arm pivoted about a pivot axis to provide a de-magnification of linear movements of said external spindle.

11. A laser as in claim 1 wherein said active chirp mitigation means comprises a stepper motor for coarse wavelength control and a piezoelectric device for fine wavelength control.

12. A laser as in claim 1 and further comprising a pressure wave mitigation means for preventing wavelength chirp resulting from temperature caused changes in the arrival times, within the discharge region, of reflected discharge caused pressure waves.

13. A laser as in claim 12 wherein said pressure wave mitigation means comprises at least one baffle having a saw-tooth shaped cross section.

14. A laser as in claim 13 wherein said saw-tooth shaped cross section has saw-teeth of varying shapes.

15. A laser as in claim 14 wherein said saw-teeth define pitches ranging from about 0.390 inch to about 0.590 inch with teeth heights ranging from about 0.120 inch to about 0.280 inch.

16. A laser as in claim 13 wherein said saw-teeth are aligned generally in directions perpendicular to the beam direction.

17. A laser as in claim 13 wherein said saw-tooth shaped cross section is machined in walls of said chamber.

18. A laser as in claim 13 wherein said baffle is comprised of nickel coated aluminum.

19. A laser as in claim 13 wherein said baffle is comprised of metal acoustic diffuser plate.

20. A laser as in claim 12 wherein said pressure wave mitigation means comprises a baffle having a groove shaped cross section.

21. A laser as in claim 20 wherein said grooves are shaped to produce interference of pressure waves with themselves so as to scatter the waves in many directions after than perpendicular to the beam direction.

22. A laser as in claim 12 wherein said pressure wave mitigation means comprises unwoven loosely packed fibers.

23. A laser as in claim 22 wherein said fibers are aluminum oxide fibers.

24. A laser as in claim 22 wherein said fibers are comprised of zirconium and yttrium.

25. A laser as in claim 12 and further comprised of a heat exchanger means for producing a temperature gradient in the laser gas in the beam direction of at least 40° C.

26. A laser as in claim 12 wherein said pressure wave mitigation means comprises a heat exchanger means for producing laser gas temperatures in said chamber which vary along the beam direction in increasing and decreasing increments of at least 10° C.

27. A laser as in claim 12 wherein said pressure wave mitigation means comprises a fast acting gas heater system positioned apply heat to the laser gas during laser down times approximately equal to heat added to the gas by discharges between the electrodes when the laser is operating.

28. A laser as in claim 12 programmed to operate continuously at a repetition rate in excess of 1000 Hz and further comprising beam delivery optical equipment to provide illumination for at least two separate stepper or scanner systems providing bursts of pulses alternatively to the two systems.

29. A laser as in claim 12 wherein said at least two separate stepper or scanner systems are part of a single stepper or scanner machine.

30. An electric discharge laser with active wavelength chirp mitigation comprising:
A) a laser chamber,
B) an elongated electrode structure enclosed within said chamber comprising an elongated anode and an elongated cathode separated by a distance defining a discharge region, said discharge region defining a long dimension in a beam direction,
C) a laser gas contained in said chamber,
D) a fan for circulating said laser within said chamber and through said discharge region,
E) a wavemeter for measuring the centerline wavelength,
F) a wavelength tuning mechanism, and
G) a feedback control system for controlling said tuning mechanism using measurement information from said wavemeter in order to actively control wavelength chirp.

31. A laser as in claim 30 wherein said tuning mechanism comprises a tuning mirror and an adjusting mechanism for adjusting the position of the tuning mirror in advance of a burst of pulses to mitigate a chirp occurring in an early part of the burst.

32. A laser as in claim 31 wherein the early occurring chirp has a duration of a few milliseconds.

33. A laser as in claim 31 wherein said adjusting mechanism comprises a stepper motor.

34. A laser as in claim 31 wherein said adjusting mechanism comprises a processor programmed with a learning algorithm for learning the shape of the early occupying chirp.

35. A laser as in claim 30 wherein said control system comprises a fast control means for providing mirror adjustments in time periods of less than 2 milliseconds.

36. A laser as in claim 30 wherein said control system comprises a fast control means for providing mirror adjustments in time periods of less than 500 microseconds.

37. A laser as in claim 30 wherein said tuning mechanism comprises a piezoelectric device.

38. A laser as in claim 30 wherein said tuning mechanism also comprises a stepper motor having an external spindle.

39. A laser as in claim 38 wherein said tuning mechanism also comprises a lever arm pivoted about a pivot axis to provide a de-magnification of linear movements of said external spindle.

40. A laser as in claim 33 wherein said tuning mechanism comprises a stepper motor for coarse tuning and a piezoelectric device for fine tuning.

* * * * *